(12) United States Patent
Asano

(10) Patent No.: US 6,442,858 B1
(45) Date of Patent: Sep. 3, 2002

(54) POSITIONING APPARATUS, EXPOSURE APPARATUS, DEVICE MANUFACTURING METHOD, AND POSITIONING METHOD

(75) Inventor: Tosiya Asano, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/494,923

(22) Filed: Feb. 1, 2000

(30) Foreign Application Priority Data

Feb. 3, 1999 (JP) ............................................. 11-026334

(51) Int. Cl.⁷ ................................................ G01B 7/30
(52) U.S. Cl. .......................................... 33/645; 33/1 M
(58) Field of Search ........................... 33/1 M, 613, 645

(56) References Cited

U.S. PATENT DOCUMENTS

| | | | |
|---|---|---|---|
| 3,166,844 A | * 1/1965 | Pascoe et al. ................. | 33/1 M |
| 5,561,299 A | * 10/1996 | Ishida et al. .................. | 33/1 M |
| 5,684,856 A | 11/1997 | Itoh et al. ..................... | 378/34 |
| 5,917,580 A | 6/1999 | Ebinuma et al. .............. | 355/53 |
| 5,983,513 A | * 11/1999 | Yamaguchi et al. .......... | 33/1 M |

FOREIGN PATENT DOCUMENTS

| | | |
|---|---|---|
| JP | 7-193114 | 7/1995 |
| JP | 10-270349 | 9/1998 |

OTHER PUBLICATIONS

Korean Office Action dated Jan. 28, 2002 of the Corresponding Korean patent application No. 10–2000–0005543.

* cited by examiner

*Primary Examiner*—G. Bradley Bennett
(74) *Attorney, Agent, or Firm*—Fitzpatrick, Cella, Harper & Scinto

(57) ABSTRACT

A positioning apparatus includes a base having a reference surface, a substage movable with respect to the base, a first actuator for moving the substage with respect to the base, a main stage movable with the substage with respect to the base, a member for transmitting a force between the main stage and the substage and a second actuator for positioning the main stage. When accelerating/decelerating the main stage, the substage is driven by using the first actuator to transmit a force from the substage to the main stage through the transmission member and when causing the main stage to move at a constant speed or to stop, the main stage is positioned by using the second actuator.

32 Claims, 20 Drawing Sheets

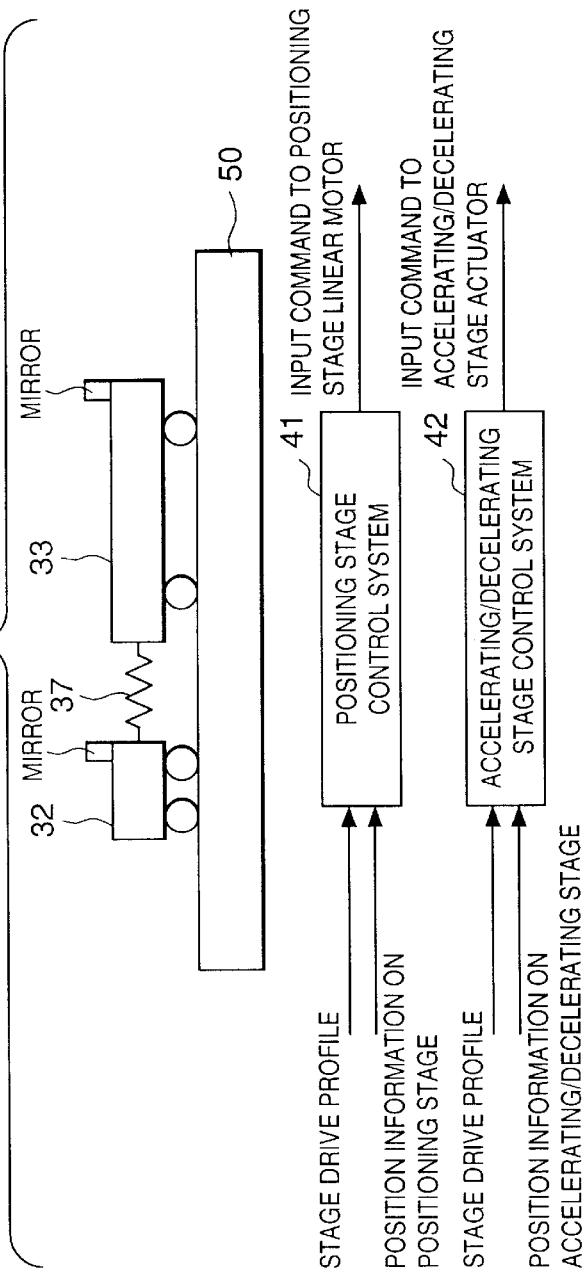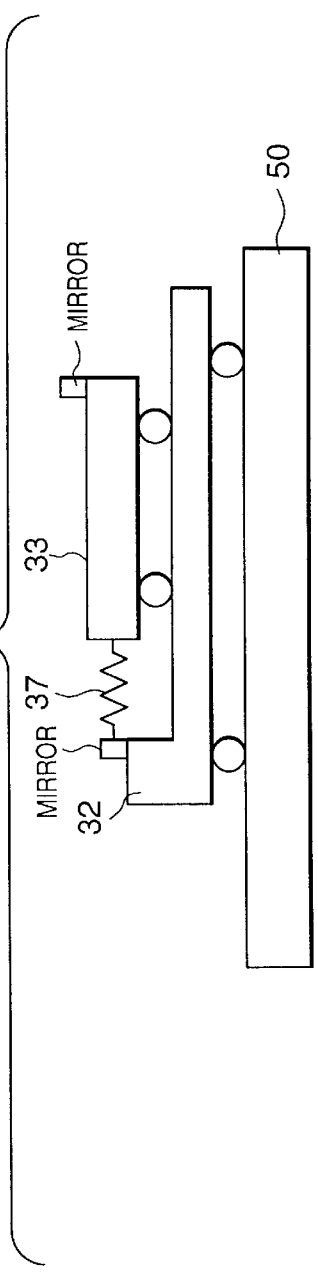

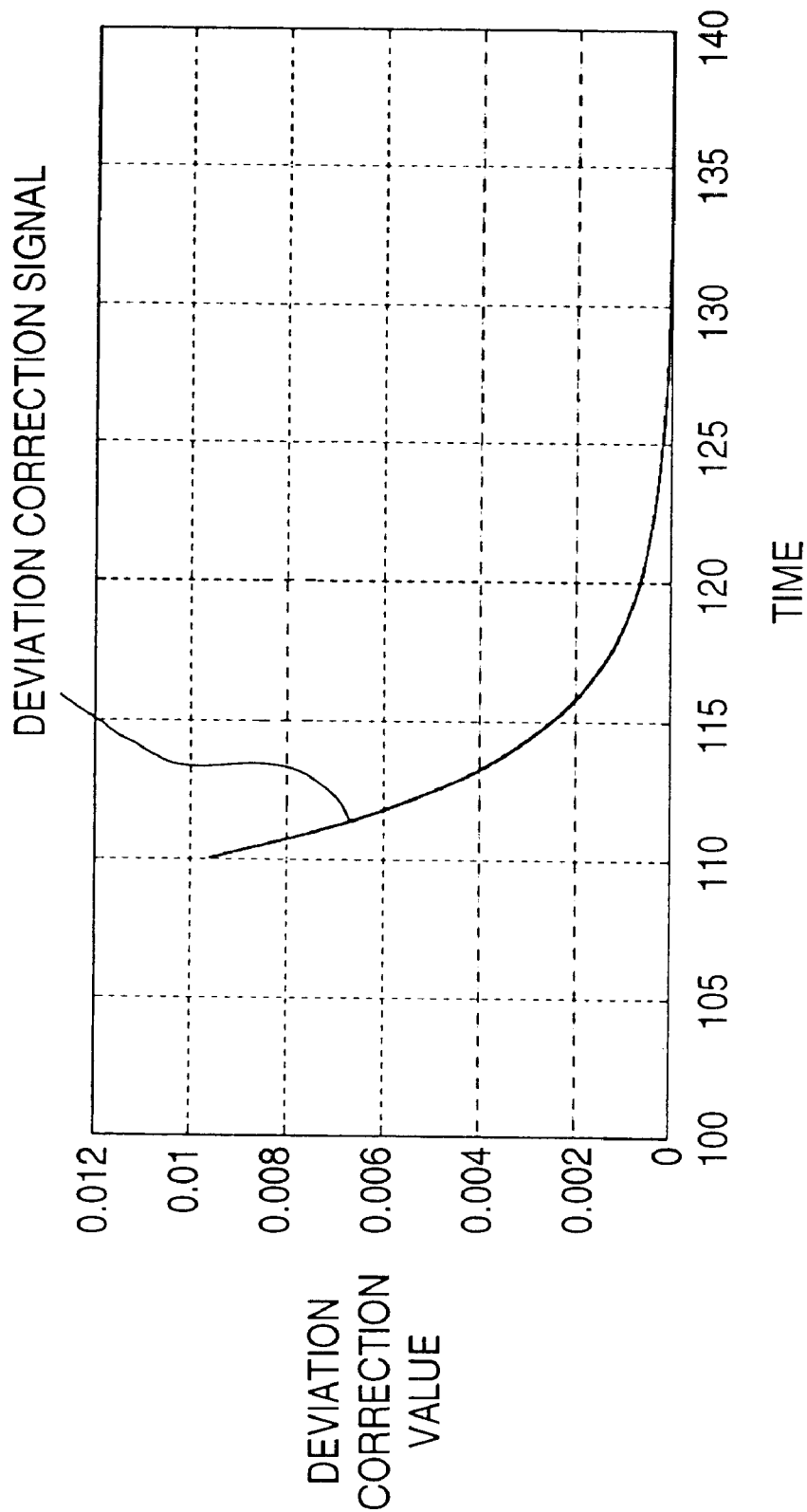

POSITIONING APPARATUS, EXPOSURE APPARATUS, DEVICE MANUFACTURING METHOD, AND POSITIONING METHOD

BACKGROUND OF THE INVENTION

The present invention relates to a positioning apparatus and, more particularly, to a positioning apparatus for positioning an exposure apparatus for forming a pattern on a substrate such as a semiconductor wafer or liquid crystal display panel, and to an exposure apparatus and a device manufacturing method which enable high-precision exposure by correctly holding the posture of a substrate serving as a target exposure object.

Conventionally, an exposure apparatus, such as a stepper, which projects a semiconductor device manufacturing pattern drawn on a mask or reticle onto a wafer, has a function of aligning the reticle and the wafer with each other. After the reticle and wafer are aligned with each other in accordance with this function, exposure is performed. This alignment is generally performed in the following manner. More specifically, a displacement between an original plate, such as a reticle, where a pattern to be exposed is drawn, and a target exposure object (substrate) such as a wafer is measured. Then, on the basis of the measurement result, the target exposure object is moved in a step-and-repeat manner under a control operation based on the measurement value obtained by a laser interferometric measuring machine, or the original plate and the target exposure object are moved.

A step-and-repeat type or step-and-scan type stepper must position a wafer stage, for example, which moves while holding a target exposure object (wafer), at very high precision because of its resolution and overlaying precision. In addition, in recent years, a high positioning speed is sought so that the productivity is increased.

FIG. 20 shows a model for the arrangement of a straight uniaxial positioning stage.

A stage 110 is guided on a surface plate 111 to be reciprocally movable in a straight direction. A reticle, a wafer, and other works (not shown) are placed on the stage 110. A linear motor stator (not shown) comprised of a magnet and yoke faces the stage 110 in a noncontact manner. The linear motor stator is supported by the surface plate 111. A reflecting mirror 112 is provided to the stage 110 to measure its position with a laser interferometer (not shown). Reference numeral 113 denotes a stage control system, for sending a control input command to the linear motor on the basis of a stage drive profile and the measured stage position. In practice, the stage 110 operates in the following manner. The stage 110, on which a predetermined reticle, wafer, and other works are mounted, is set in a still state. A current in a predetermined direction is supplied to a predetermined linear motor coil for a predetermined period of time in accordance with the stage position in order to accelerate the stage 110. Once the stage 110 has reached a desired speed and position, the stage control system 113 controls the stage 110 to scan it at a constant speed. While the stage 110 performs scanning, predetermined exposure, inspection, and the like are performed. After these predetermined operations are ended, a predetermined current is supplied to the linear motor coil to decelerate the stage 110 until it stops.

To achieve high-speed stage operations, the stage must be accelerated and decelerated quickly and with large magnitudes. With the above stage arrangement, operations started with acceleration and ended with positioning are performed by driving the same linear motor. If the acceleration of the stage increases, heat generated by the linear motor increases. Since the stage and the linear motor are close to each other, heat generated by the linear motor may deform the stage or work by thermal expansion, decreasing the positioning precision and exposure, machining, or inspecting precision. Heat generated by the linear motor disorders the air density of the optical path of the laser interferometer, thus degrading the measuring precision of the stage position.

SUMMARY OF THE INVENTION

It is an object of the present invention to provide a positioning apparatus having low-heat generation, high-speed, and high-precision performance.

In order to achieve the above object, according to the present invention, there is provided a positioning apparatus characterized by comprising a surface plate having a reference surface, a substage movable with respect to the surface plate, a first actuator for moving the substage with respect to the surface plate, a main stage movable with respect to the surface plate, a member for transmitting a force between the main stage and the substage, and a second actuator for positioning the main stage, wherein when accelerating/decelerating the main stage, the substage is driven by using the first actuator, to transmit a force from the substage to the main stage through the transmission member, and when causing the main stage to move at a constant speed or to stop, the main stage is positioned by using the second actuator.

The second actuator may be controlled in accordance with a time that elapses from a start time of acceleration/deceleration, or in accordance with a magnitude of acceleration/deceleration of the substage. The second actuator may be controlled in accordance with a speed of the main stage, or in accordance with a magnitude of a position deviation of the main stage.

A control system for controlling the second actuator desirably corrects a position deviation signal of the main stage with respect to a target position by using a deviation correction signal, and desirably controls the second actuator on the basis of the corrected position deviation signal. The positioning apparatus preferably has a deviation correction signal generator for generating the deviation correction signal.

The magnitude of the deviation correction signal upon a start of controlling the second actuator is desirably substantially equal to that of the position deviation correction signal obtained when the control system for controlling the second actuator starts a control operation. The gradient of the deviation correction signal upon a start of controlling the actuator is preferably substantially equal to that of the position deviation signal obtained when the control system for controlling the actuator starts the control operation.

The second actuator is desirably a noncontact actuator which generates a driving force in a noncontact manner, and is preferably a linear motor.

The movable element of the linear motor is desirably provided to the main stage, and the stator thereof is desirably provided to the surface plate. The movable element of the linear motor may be provided to the main stage, and the stator thereof may be provided to the substage.

The transmission member desirably transmits a force between the main stage and the substage in a direction along which the substage moves, and is preferably a spring element.

The transmission member is desirably a noncontact bearing which keeps the main stage and the substage apart from each other, and preferably has a static pressure bearing or a bearing utilizing magnetism.

The main stage is desirably supported on the reference surface.

The main stage is desirably placed on the substage.

The substage is desirably a two-dimensional stage movable in two-dimensional directions on the reference surface. The transmission member is preferably a radial bearing.

The main stage is desirably movable with respect to the substage in a direction parallel to the reference surface.

The positioning apparatus desirably has a driving mechanism for driving the main stage with respect to the substage in a direction perpendicular to the reference surface.

The main stage is desirably movable with respect to the substage in six axial directions.

A support mechanism for supporting the main stage with respect to the substage in a vertical direction desirably utilizes a reaction force of a pilot-pressure chamber or a repulsive force of a magnet.

In order to achieve the above object, according to the present invention, there is also provided a positioning method characterized by comprising the first acceleration step of accelerating a substage, the second acceleration step of transmitting a driving force from the substage to a main stage through a noncontact bearing provided between the substage and the main stage, thereby accelerating the main stage, and the positioning step of positioning the main stage with an actuator provided between the substage and the main stage. The positioning step further has the correction step of correcting a position deviation signal with respect to a target position, and the control step of controlling the actuator on the basis of the corrected position deviation signal.

The correction step desirably comprises generating a deviation correction signal having the same magnitude as that of the position deviation signal, and controlling the actuator on the basis of a difference in magnitude between the position deviation signal and the deviation correction signal.

The correction step desirably comprises generating a deviation correction signal having the same gradient as that of the position deviation signal, and controlling the actuator on the basis of a difference in gradient between the position deviation signal and the deviation correction signal.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIGS. 1A and 1B are views showing a model for a positioning apparatus according to the first embodiment;

FIG. 8 is a graph showing a position correction signal;

DETAILED DESCRIPTION OF THE PREFERRED EMBODIMENTS

First Embodiment

Figure 2:
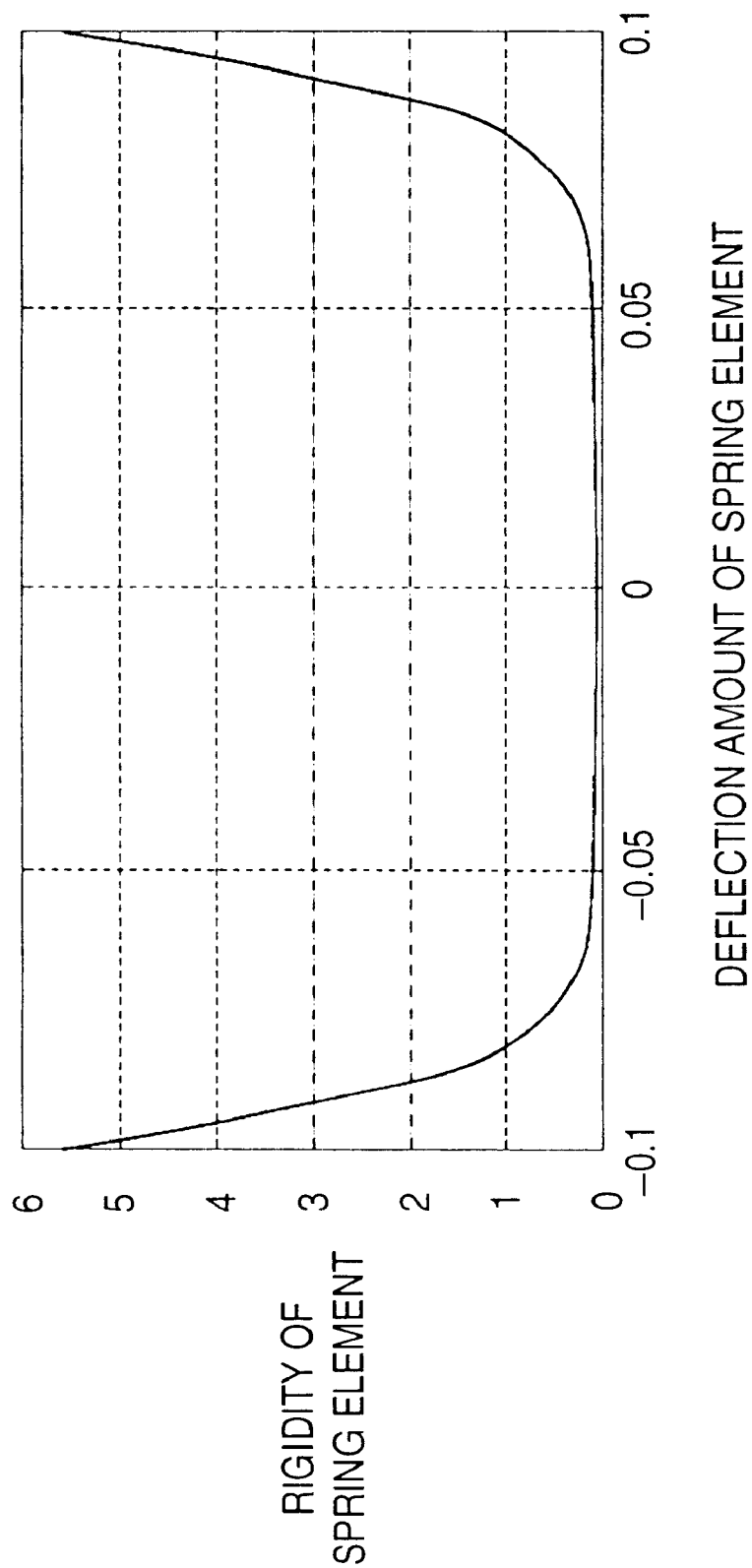
FIG. 2 is a graph showing the rigidity of a spring element.

FIGS. 1A and 1B are views showing a model for a stage apparatus according to the present invention.

Referring to FIG. 1A, a target positioning object (not shown) such as a reticle or wafer is placed on a positioning stage 33. The positioning stage 33 is guided to be reciprocally movable in a direction parallel to the reference surface of a base 50. The positioning stage 33 is supported on the reference surface of the base 50 by a static pressure bearing. Reference numeral 32 denotes an accelerating/decelerating stage 32. Tee accelerating/decelerating stage 32 is guided on the reference surface of the base 50 in the same manner as the positioning stage 33. The accelerating/decelerating stage 32 is supported on the reference surface of the base 50 by a static pressure bearing. An actuator (not shown) is provided to the accelerating/decelerating stage 32. As described above, the positioning stage 33 is placed on the reference surface of the base 50. However, the stage apparatus of the present invention is not limited to this, and a positioning stage 33 may be mounted on an accelerating/decelerating stage 32. (FIG. 1B)

The actuator for driving the accelerating/decelerating stage 32 may be a direct driven type stage such as a linear motor, or may be a combination in of a rotary motor and feed screw, and is not particularly limited here.

The positioning stage 33 is provided with a linear motor serving as the actuator (not shown). A linear motor movable element (not shown) comprised of a magnet and yoke is provided to the positioning stage 33 side. A linear motor stator (not shown) having a coil and facing the linear motor movable element may be attached to the accelerating/decelerating stage 32 or the base 50. Considering the stroke of the linear motor, if the linear motor stator is provided to the positioning stage 33, the stator can be made small.

A spring element 37 extends between the accelerating/decelerating stage 32 and positioning stage 33 to connect them. The spring element 37 may be a mechanical spring such as a coil spring, and is desirably a noncontact type spring. A spring element 37 which utilizes an air film, like an air bearing, or attracting force or repulsive force produced by magnetism is preferable. The spring element 37 may be a passive one, or an active one using a low-heat actuator.

A reflecting mirror is provided to the positioning stage 33 to measure its position in the moving direction with a laser interferometer (not shown). A reflecting mirror is also provided to the accelerating/decelerating stage measure its position in the moving direction. The position of the accelerating/decelerating stage 32 may be measured from the reference position directly, or be calculated by using the measurement values of the positions of the accelerating/decelerating stage 32 and positioning stage 33 relative to each other and the measurement value of the positioning stage 33.

The positioning stage 33 and accelerating/decelerating stage 32 are respectively provided with a positioning stage control system 41 and an accelerating/decelerating stage control system 42. The positioning stage control system 41 and accelerating/decelerating stage control system 42 respectively send commands to the corresponding actuators on the basis of a predetermined stage drive profile and the respective stage measurement positions.

The positioning stage control system 41 serves to supply a large driving force to the actuator of the accelerating/decelerating stage 32 to accelerate or decelerate it, thereby driving the positioning stage 33 through the spring element 37. The accelerating/decelerating stage control system 42 controls the accelerating/decelerating stage 32 on the basis of a predetermined stage drive profile and the measured position of the accelerating/decelerating stage 32.

When the acceleration or deceleration is large, the positioning stage control system 41 does not control the actuator of the positioning stage 33, but the positioning stage 33 is accelerated or decelerated by the driving force transmitted from the accelerating/decelerating stage 32 through the spring element 37. When the acceleration or deceleration is almost ended and the driving force transmitted from the accelerating/decelerating stage 32 decreases, the positioning stage control system 41 starts a control operation to finally position the positioning stage 33.

While the positioning stage control system 41 performs positioning, the positioning error of the accelerating/decelerating stage 32 itself caused by the vibration of the accelerating/decelerating stage 32 or the like is transmitted as a disturbance to the positioning stage 33 through the spring element 37. Accordingly, the rigidity of the spring element 37 during positioning is preferably as small as possible, and is ideal if it is zero. During acceleration or deceleration, the positioning stage 33 is driven through the spring element 37. Accordingly, the rigidity of the spring element 37 is preferably as large as possible.

Hence, the spring element 37 of the present invention should have rigidity change characteristics with respect to its deflection amount as shown in FIG. 2 (numerals in the graph are standardized. This applies to the following description).

According to the nature of the spring element shown in FIG. 2, the rigidity is large when the deflection amount is small, and decreases close to zero when the deflection amount is small.

Figure 3A:
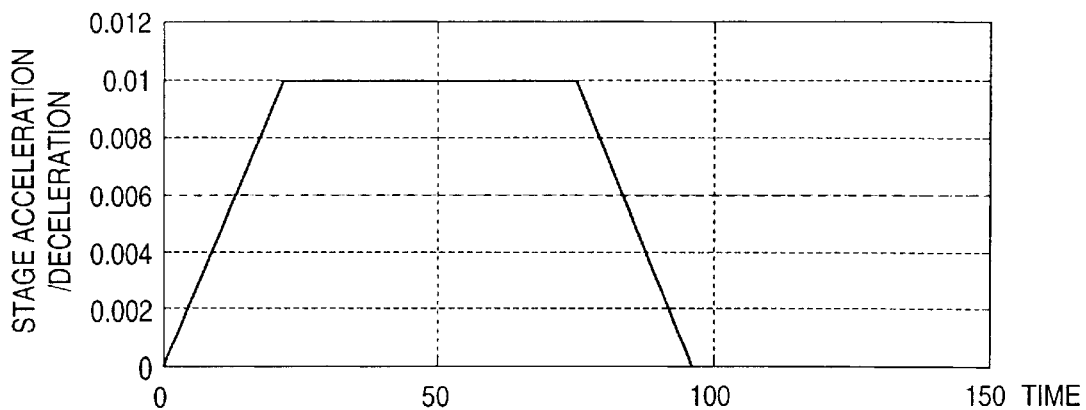
FIGS. 3A to 3C show graphs of the stage drive profile of the positioning apparatus according to the first embodiment.
Figure 3B:
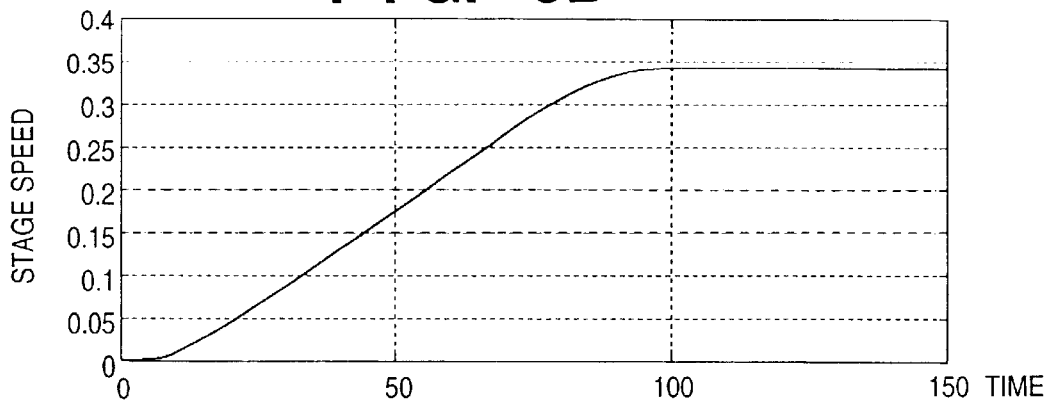
Figure 3C:
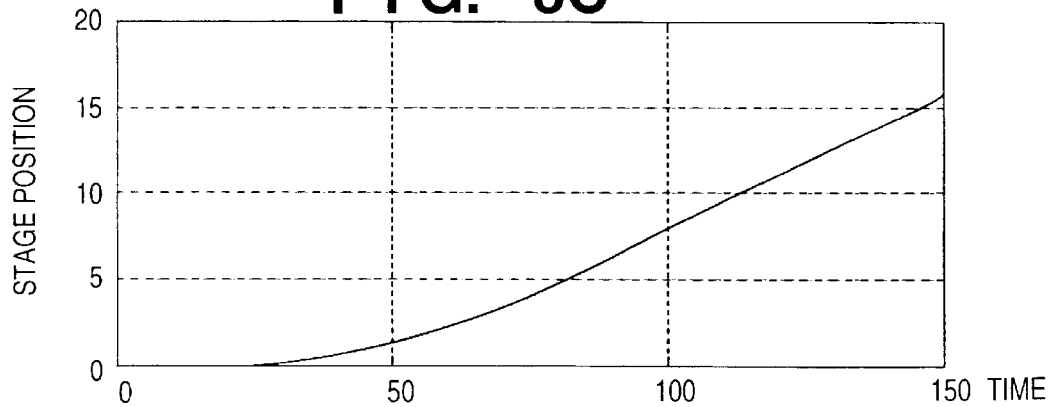

In the stage apparatus having the above arrangement, assume that a driving operation as shown in FIGS. 3A to 3C is to be performed. This driving operation aims at performing a predetermined task during a uniform motion after time 100.

The accelerating/decelerating stage control system 42 generates a control input on the basis of the target acceleration profile and the position information of the accelerating/decelerating stage 32 shown in FIGS. 3A to 3C, to drive the accelerating/decelerating stage 32. In the acceleration period until time 100, the positioning stage control system 41 does not function. Therefore, the positioning stage 33 is accelerated upon reception of only a driving force from the accelerating/decelerating stage 32 through the spring element 37. After time 100, the positioning stage control system 41 starts to function. The timing at which the positioning stage control system 41 starts a control operation is 10 when the ratio of the stage speed to the target speed falls within a predetermined range, 2) when the ratio of the stage position to the target position falls within a predetermined range, 3) when a predetermined period of time elapses after acceleration or deceleration is ended, or the like. This timing is appropriately set in accordance with the characteristics of the spring element 37 and the stage drive pattern.

Figure 4:
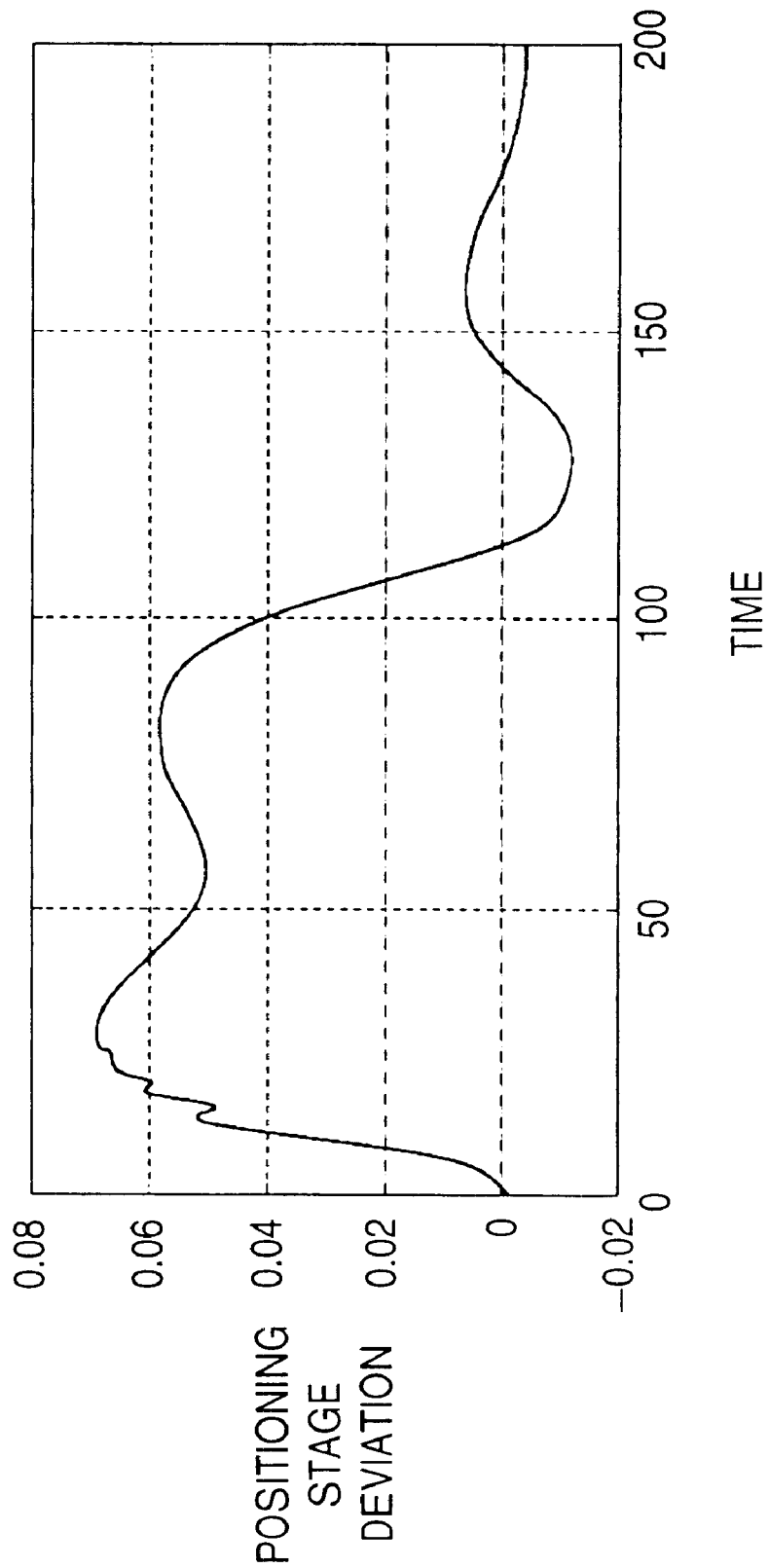
FIG. 4 is a graph showing a positional error of a positioning stage from a target position.

FIG. 4 shows a positional error (to be referred to as a positioning stage deviation hereinafter) of the position stage from the target position when the positioning stage control system 41 is not operated from the start to the end of acceleration. Vibrations shown in FIG. 4 are produced by the spring element 37.

FIGS. 4 to 6B show control simulation.

FIG. 4 shows a positional error (to be referred to as a positioning stage deviation hereinafter) of the position stage from the target position when the positioning stage control system 41 is not operated from the start to the end of acceleration. Vibrations shown in FIG. 4 are produced by the spring element 37.

Figure 5A:
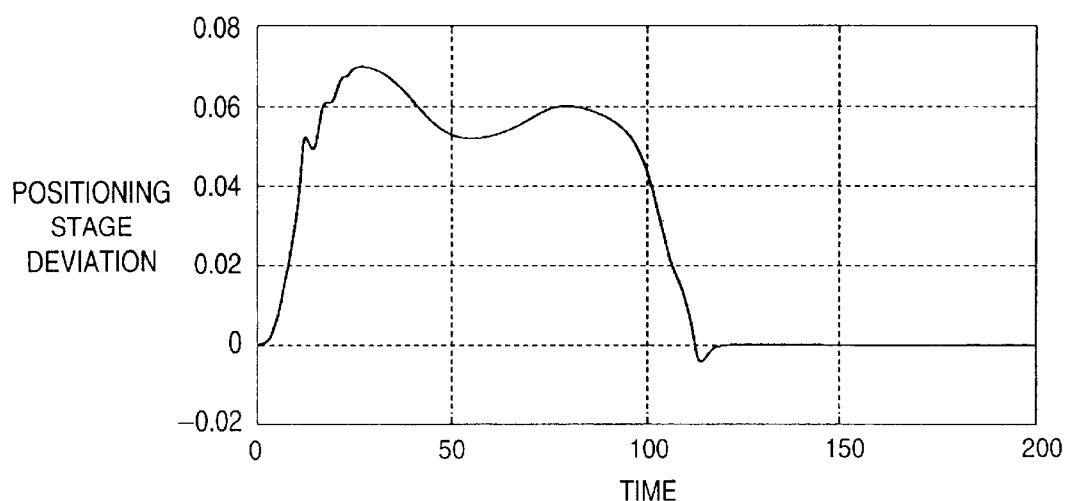
FIGS. 5A and 5B are graphs showing a deviation and a control command when a control scheme according to the first embodiment is adopted.
Figure 5B:
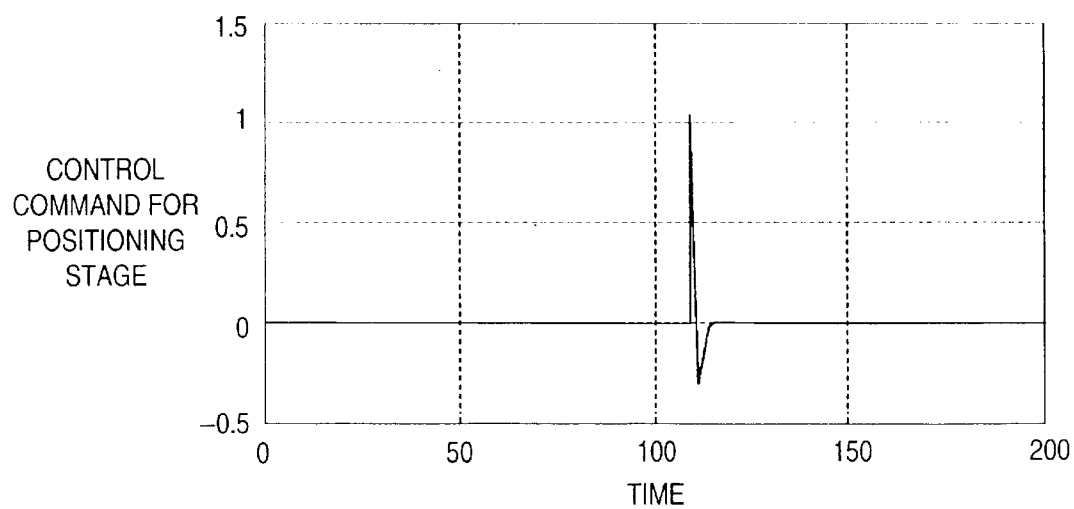

FIG. 5A shows a positioning stage deviation obtained when the control scheme according to the present invention is employed. In FIG. 5A, the positioning stage control system 41 functions from time 110. FIG. 5B shows a control command (its dimension is force; to be referred to as a control input hereinafter) for the linear motor of the positioning stage 33 specified by the positioning stage control system 41.

Figure 6A:
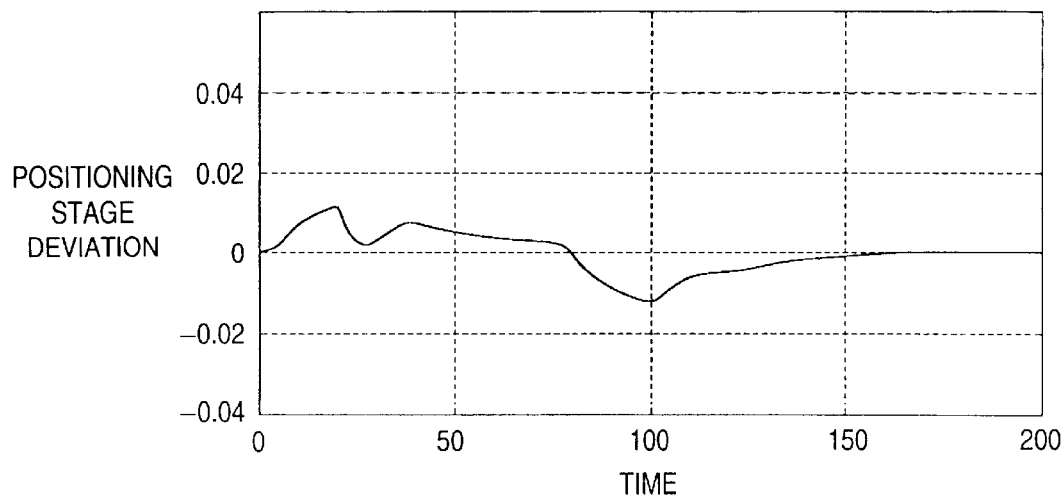
FIGS. 6A and 6B are graphs as a reference for comparison with FIGS. 5A and 5B.
Figure 6B:
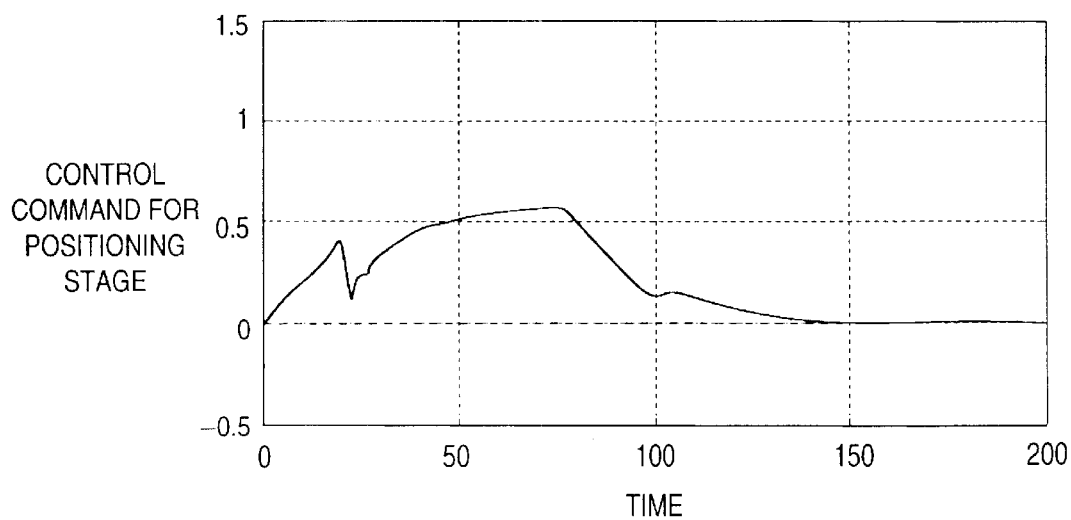

FIGS. 6A and 6B are graphs as a reference for comparison with FIGS. 5A and 5B. In FIGS. 6A and 6B, the positioning stage control system 41 functions from the start of acceleration. In FIG. 6A, the positioning stage deviation is minimized during acceleration as well. In contrast to this, in FIG. 6B, the control input is large. Assume that the same linear motor (having the same thrust constant and the same resistance) is used in FIGS. 5A and 5B, and FIGS. 6A and 6B. When the total energy consumed by the linear motor from time 0 to time 150 is calculated, in FIGS. 5A and 5B, it is merely 3% that of FIGS. 6A and 6B. Heat generated by the linear motor can thus be minimized.

The actuator of the accelerating/decelerating stage 32 must have an energy sufficient for accelerating the accelerating/decelerating stage 32 and positioning stage 33, and can be disposed away from the positioning stage 33. Even if the actuator of the accelerating/decelerating stage 32 generates heat, it adversely influences the positioning stage 33 and the target object mounted on the positioning stage 33 only a little.

With the control system of the present invention, the positioning stage deviation during acceleration increases. However, it is during a uniform-motion period after time 100 that final positioning is required, as described above. Therefore, the magnitude of the positioning stage deviation during acceleration poses no problem.

In this manner, when the stage arrangement and the control system according to the present invention are used, high-speed, high-precision positioning of the positioning stage 33 can be realized while suppressing heat generation as much as possible.

Referring to FIG. 5B, it is apparent that a large impulse control input be generated instantaneously when the positioning stage control system 41 is started to function. The positioning stage control system 41 forms a very high-band control system in order to perform high-precision positioning. Accordingly, when the positioning stage control system functions with a large positioning stage deviation, this instantaneous impulse control input is generated.

To output such an instantaneous control input poses a large load to an electrical system that drives the linear motor and is thus not preferable.

Figure 7:
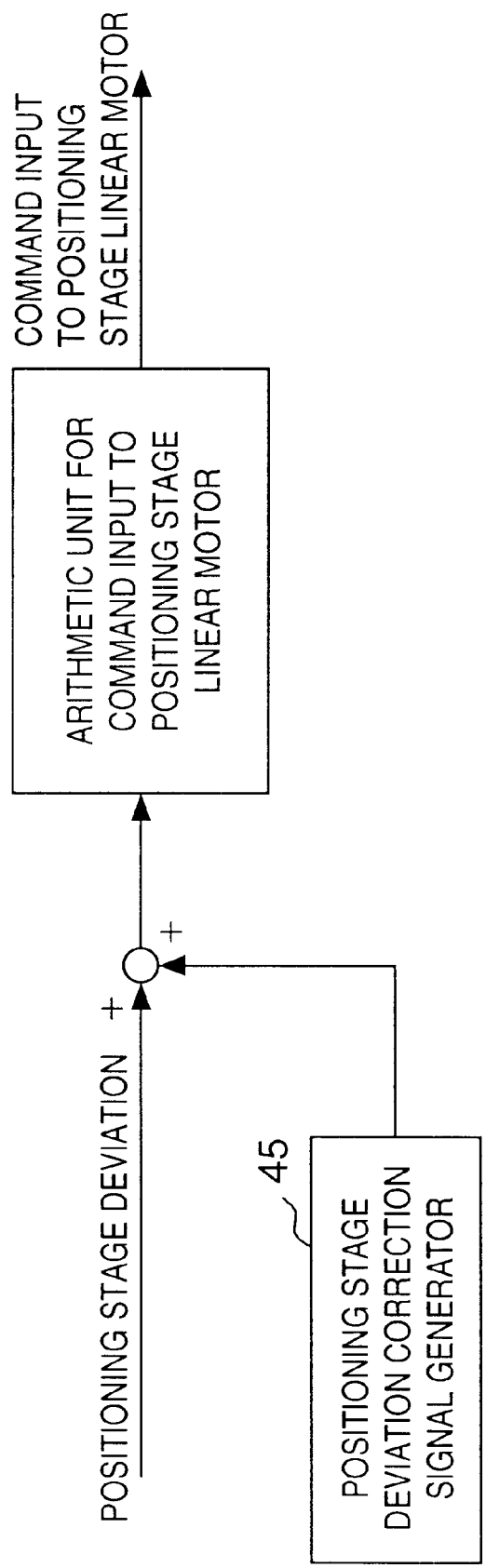
FIG. 7 is a diagram showing a control system using a positioning stage deviation correction signal generator.

In the present invention, a control system shown in FIG. 7 is employed to improve this point.

Referring to FIG. 7, reference numeral 45 denotes a positioning stage deviation correction signal generator. The positioning stage deviation correction signal generator 45 is newly added in the positioning stage control system 41 of the arrangement of the positioning apparatus shown in FIG. 1A.

In the process from the time when the positioning stage control system 41 starts the control operation to the time when it eliminates a deviation, the positioning stage deviation correction signal generator 45 does not eliminate the deviation quickly, but generates a signal for correcting a deviation signal in order to eliminate the deviation along a certain target value.

FIG. 8 shows a deviation correction signal generated by the positioning stage deviation correction signal generator 45.

Figure 9A:
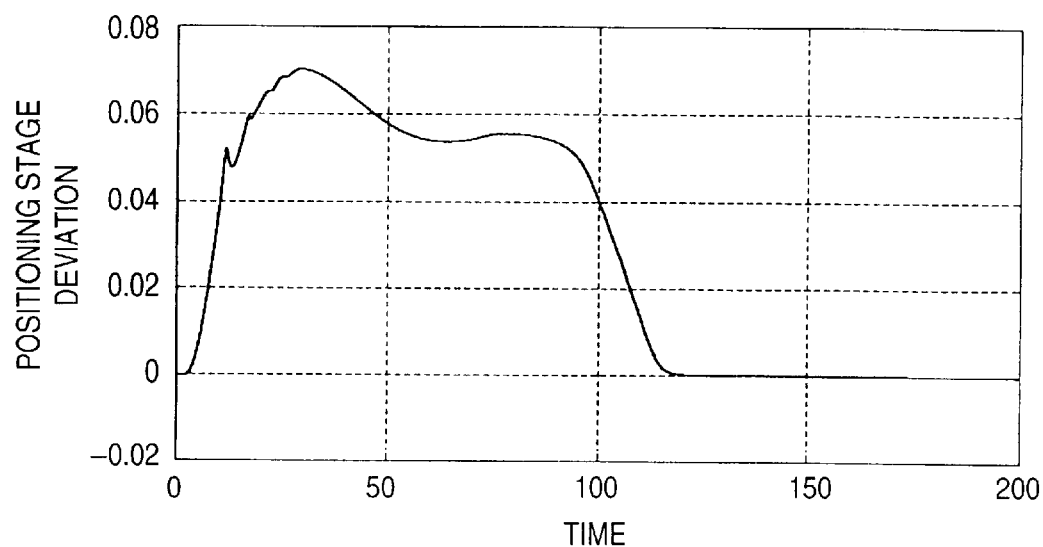
FIGS. 9A and 9B are graphs showing the deviation of the positioning stage and a control command for it when the control system shown in FIG. 7 is used.
Figure 9B:
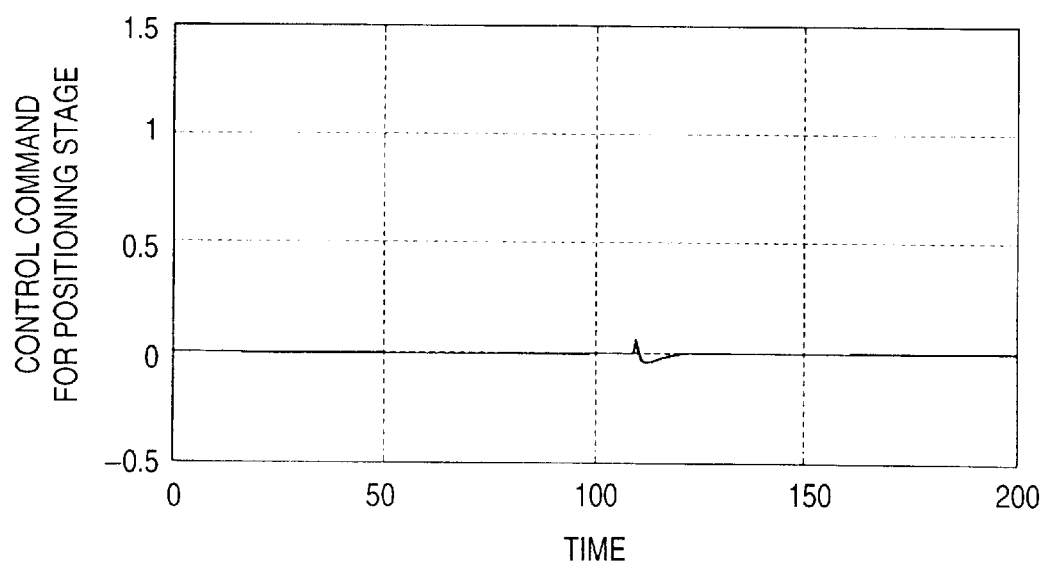

The positioning stage control system 41 performs a control operation by using, as a deviation in the control system, a value obtained by subtracting the deviation correction signal from the positioning stage deviation, and generates a control command for the positioning stage 33 as shown in FIGS. 9A and 9B.

Figure 10:
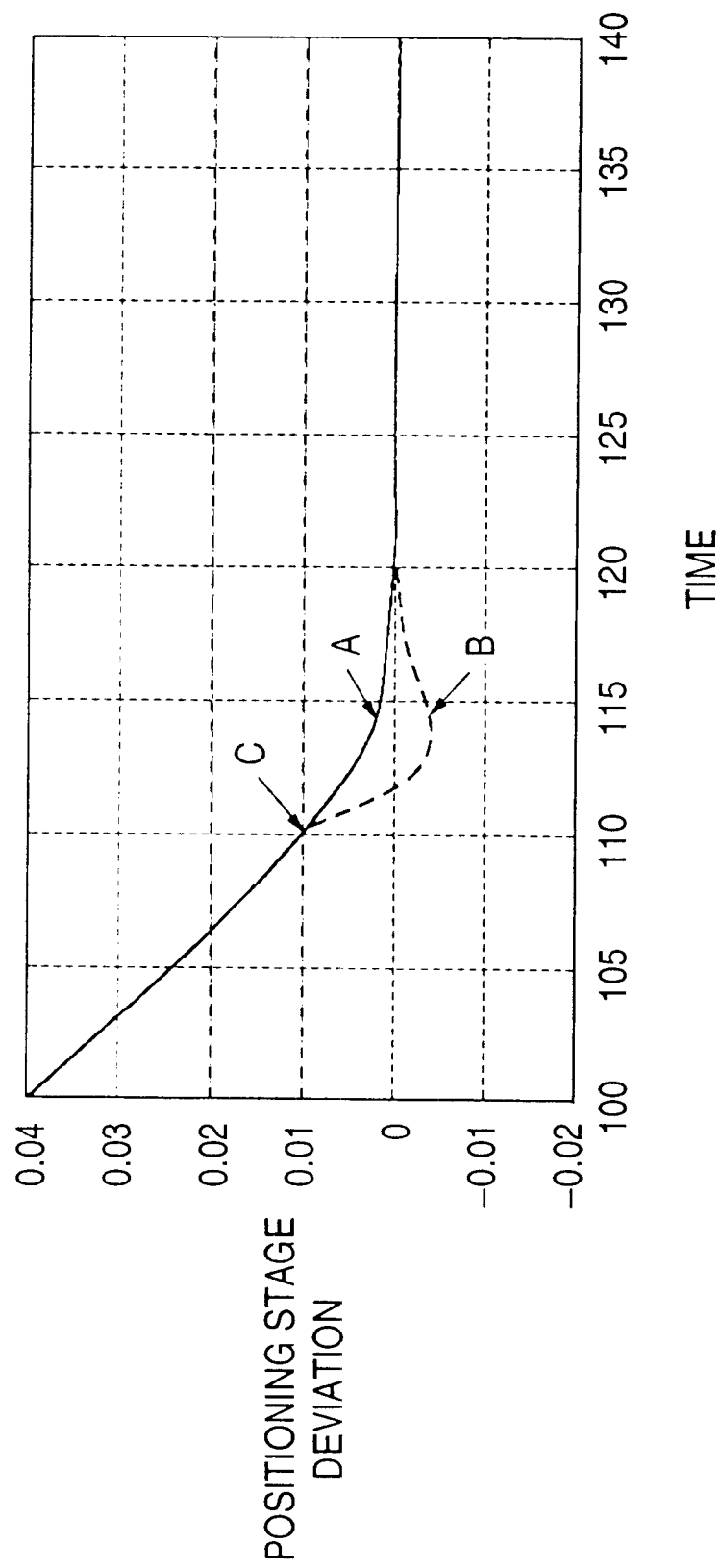
FIG. 10 is a graph showing the deviation of the positioning stage near the start of a control operation of the positioning stage control system.

FIG. 10 shows a positioning stage deviation near the start of a control operation of the positioning stage control system.

In FIG. 10, a solid line A shows a case wherein a deviation correction signal is used, and a broken line B shows a case wherein a deviation correction signal is not used (the same as in FIG. 5A).

With the deviation correction signal used in FIG. 8, at the start of a control operation of the positioning stage control system 41, the magnitude and gradient of the correction signal of the line A coincide with those of the correction signal of the line B. More specifically, in FIG. 10, at a time (point C in FIG. 10) of the start of a control operation of the positioning stage control system, when the deviation correction signal is used (solid line A), the positioning stage deviation continues smoothly to converge to zero along the deviation correction signal. As a result, quick deviation solution is not performed.

When the deviation correction signal is not used (broken line B), the positioning stage deviation quickly decreases to zero, and then causes an overshoot. Hence, a time required until the deviation converges to zero is not very much different from that required when the deviation correction signal is used. In short, even when a deviation correction signal is used, a time required for stage positioning does not take long.

The total energy amount of the input to the linear motor when the deviation correction signal is used can be suppressed to be as very small as about 3% that of a case when the deviation correction signal is not used. As a result, heat generation by the actuator of the positioning stage 33 can be suppressed.

In FIG. 8, the deviation correction signal employs primary delay system characteristics. As long as the deviation correction signal forms a smooth curve with which a deviation and gradient of the deviation signal coincide with those of a deviation signal obtained when the deviation correction signal is not used, substantially the same effect as this can be obtained even if it forms another curve, e.g., a curve of a quadratic function.

The foregoing is uniform-motion positioning after acceleration is ended. Note that the present invention can also be similarly applied when stopping the stage after deceleration. More specifically, the positioning stage control system 41 is turned off when deceleration increases and the driving force transmitted from the positioning stage 33 through the spring element 37 increases, and is turned on when deceleration decreases and the driving force transmitted from the positioning stage 33 decreases.

If motion required for the positioning stage 33 is step driving with which the positioning stage 33 moves a predetermined distance, this control method may be used for deceleration.

An example concerning a uni-axial direction is described above in order to schematically explain the control method for the stage apparatus of the present invention. However, the number of axes is not limited to this. For example, the present invention may be applied to at least one of X- and Y-axes of an X-Y stage movable in two orthogonal axes (X- and Y-axes) within a plane, as will be described below.

Second Embodiment

A practical stage arrangement of the embodiment described above will be described.

Figure 11:
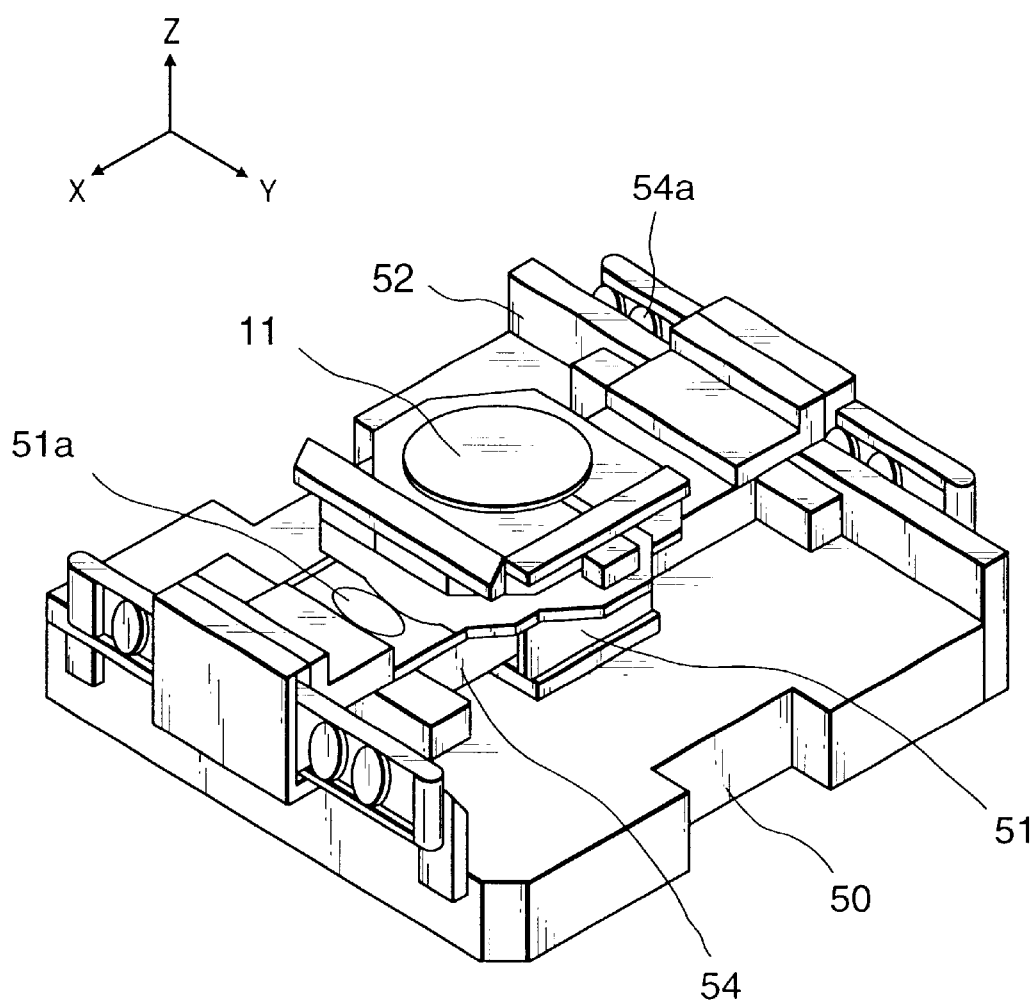
FIG. 11 is a perspective view of a six-axis wafer stage according to the second embodiment.

FIG. 11 is a perspective view of a six-axis wafer stage according to the present invention.

Reference numeral 50 denotes a surface plate; 54, a Y stage; 54a, a Y linear motor; 51, an X stage; and 51a, an X linear motor, respectively. The base 50 has a reference surface. The Y stage 54 is supported above the reference surface with a static pressure bearing and can move in the Y direction as it is guided by a Y guide 52 set on the base 50. The Y linear motor 54a drives the Y stage 54 in the Y direction, the Y linear motor stator is substantially integrated with the base 50, and the Y linear motor movable element is substantially integrated with the Y stage 54. The X stage 51 is supported above the reference surface with a static pressure bearing and can move in the X direction with respect to the Y stage 54 as the X stage 51 is guided by an X guide set on the Y stage 54. The X linear motor 51a drives the X stage 51 in the x direction with respect to the Y stage 54. The X linear motor stator of the X linear motor 51a is substantially integrated with the Y stage 54, and the X linear motor movable element thereof is substantially integrated with the X stage 51.

A four-axis static pressure θ-z-T stage E1 is mounted on the X stage 51 of the static pressure X-Y stage described above.

Figure 12:
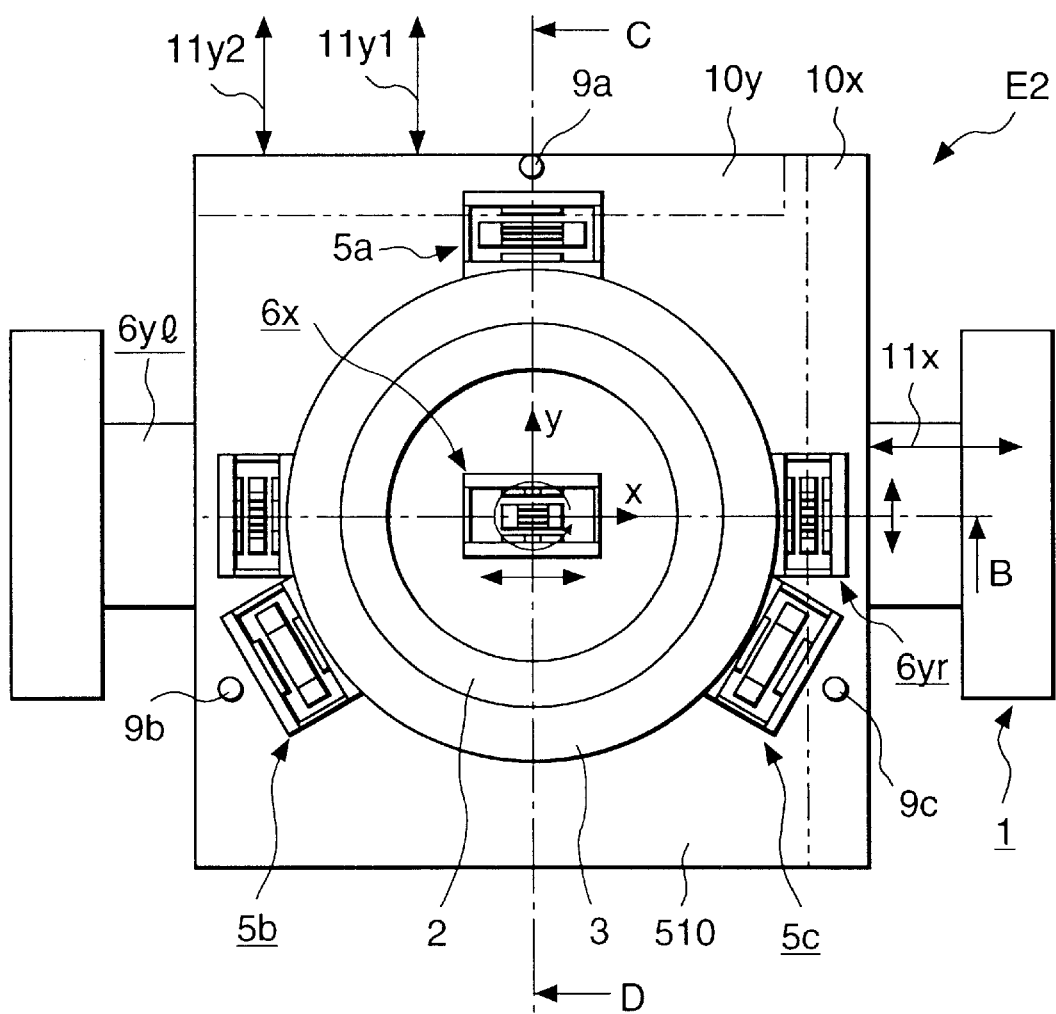
FIG. 12 is a plan view of a positioning apparatus according to the second embodiment.
Figure 13:
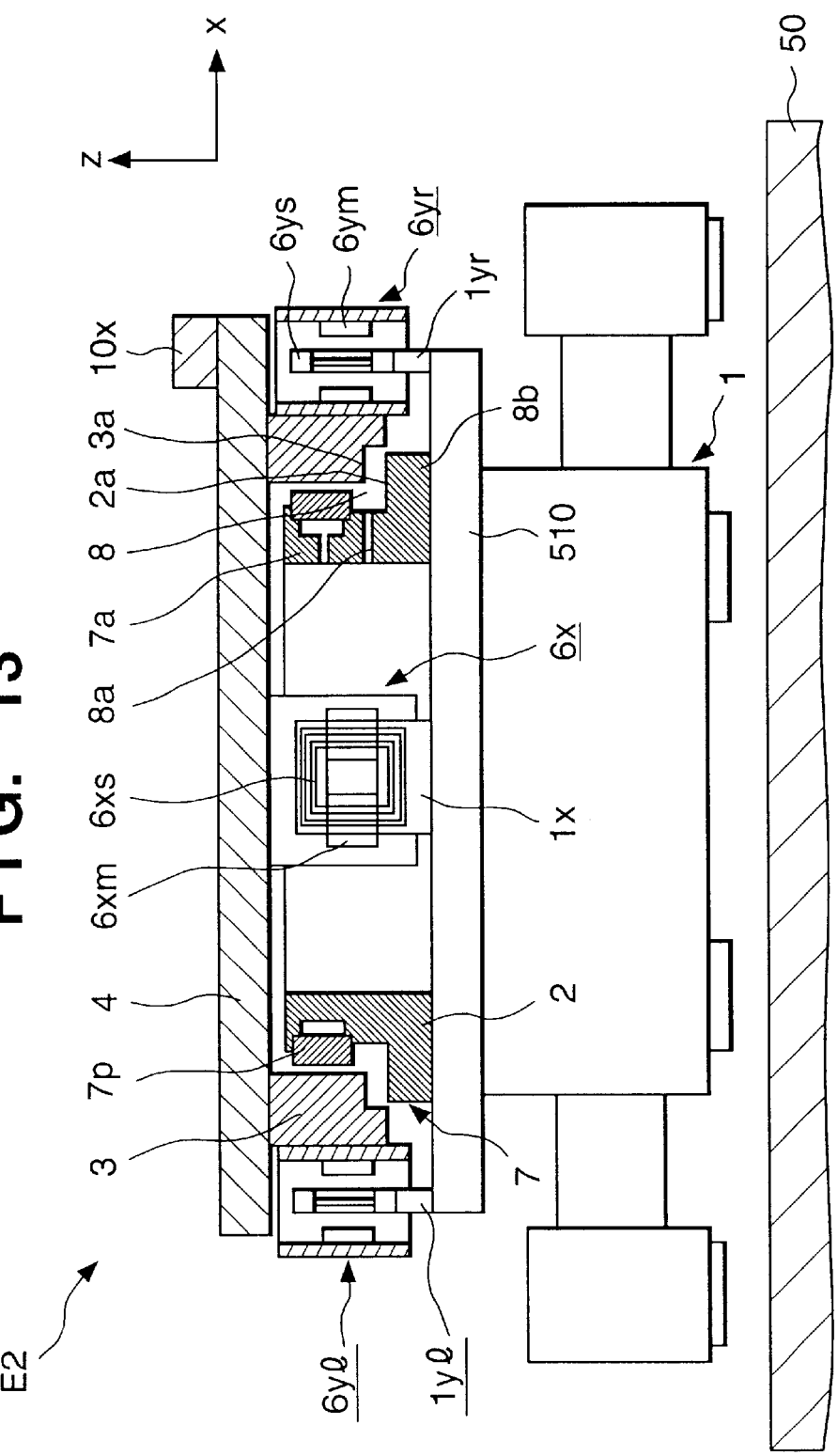
FIG. 13 is a partially sectional view of the positioning apparatus according to the second embodiment when viewed in the Y direction.
Figure 14:
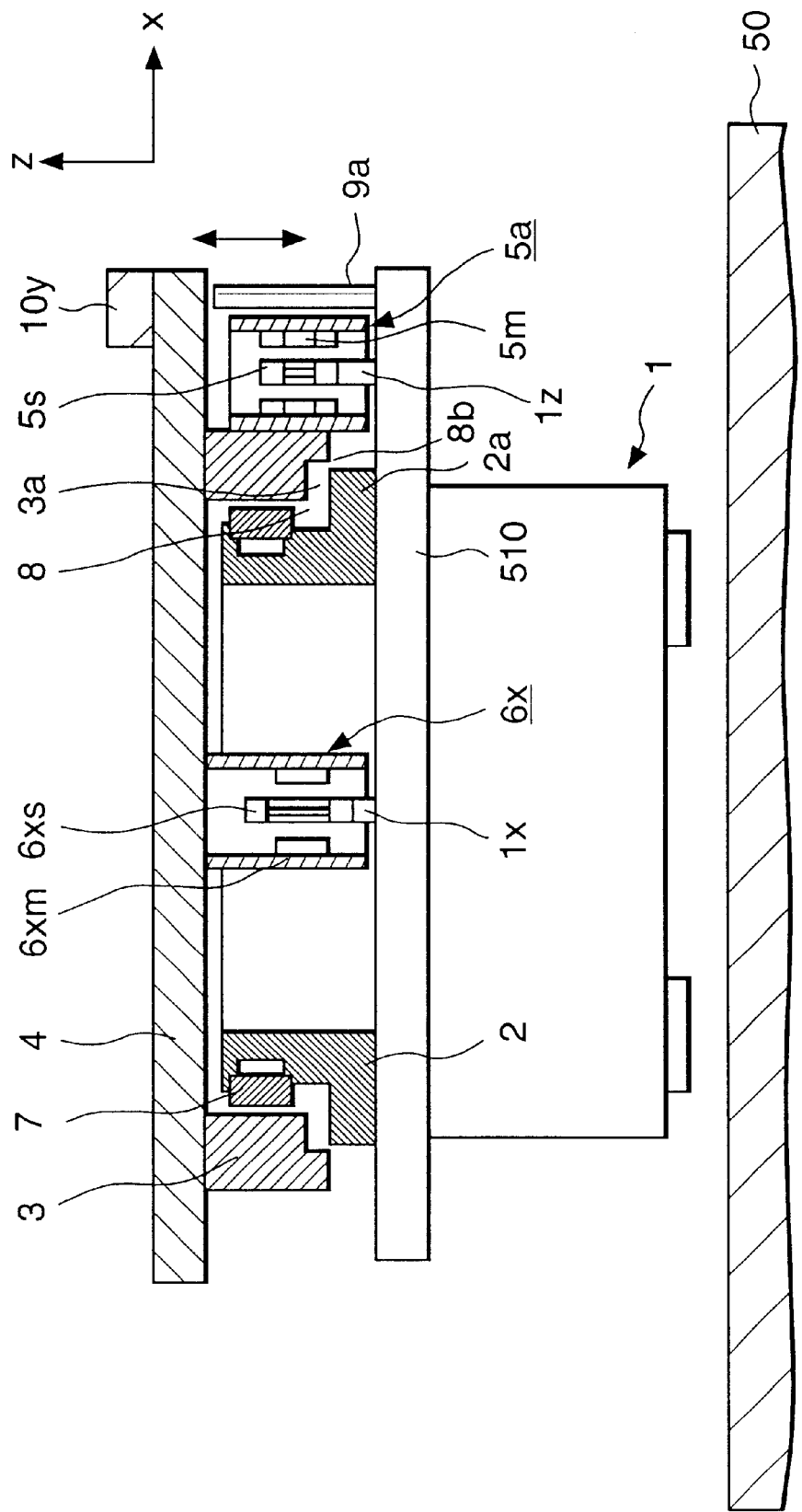
FIG. 14 is a partially sectional view of the positioning apparatus according to the second embodiment when viewed in the X direction.

FIG. 12 is a plan view of a wafer stage of this embodiment. FIG. 13 is a partially sectional view of a wafer stage apparatus according to this embodiment when viewed in the Y direction. FIG. 14 is a partially sectional view of the wafer stage of this embodiment when viewed in the X direction.

Reference numeral 1 denotes an X-Y stage identical to that described above. Reference numeral 2 denotes a cylindrical stationary member; 3, a guide member; and 4, a holding plate. The stationary member 2 is integrated with a top plate 510. The guide member 3 has a cylindrical surface facing the outer surface of the stationary member 2 serving as a support surface. The holding plate 4 is integrally connected to the upper end of the guide member 3 and has a wafer chuck (not shown) for attracting a substrate such as a wafer with a vacuum chucking force or the like.

Reference numerals 5a to 5c denote three Z linear motors for moving the holding plate 4 and top plate 510 close to and away from each other in the Z direction. Reference numerals 6 denote linear motors for generating a force in a direction to translate or rotate the holding plate 4 with respect to the top plate 510 in the XY plane.

Reference numeral 7 denotes a porous pad. The porous pad 7 serves as an annular porous restrictor type static pressure bearing held on the outer surface of the stationary member 2. The outer surface of the stationary member 2 and the inner surface of the guide member 3 serving as a guide surface are supported to be separate from each other by the static pressure of a pressurized fluid injected from the porous pad 7. In other words, the holding plate 4 is supported by the porous pad 7 in the X and Y directions, which are the moving directions of the X-Y stage 1, not to be in contact with the top plate 510. The holding plate 4 is guided by the cylindrical guide surfaces of the stationary member 2 and guide member 3 to be reciprocally movable along the central axis, which is the Z-axis, of the guide member 3, and pivotal about the Z-axis. The holding plate 4 can be tilted with respect to the Z-axis within a range allowed by the bearing gap of the porous pad 7. The tolerance of the tilt with respect to the Z-axis can be increased by decreasing the size of a porous pad 7p in the axial direction. Furthermore, the force for supporting the weights of the guide member 3, the holding plate 4, and the wafer attracted by the holding plate in the Z direction is obtained from the pressure of the pressurized fluid in a pilot-pressure chamber 8 serving as a biasing member formed by a step 2a formed on the stationary member 2 and a step 3a formed on the guide member 3.

As shown in FIG. 13, the stationary member 2 has inner flow paths 7a and 8a for supplying the pressurized fluid to the porous pad 7p and pilot-pressure chamber 8, respectively. The lower ends of the steps 3a and 2a of the guide member 3 and stationary member 2 form a labyrinth seal 8b. The gap between the porous pad 7p and guide member 3 is about 7 μm and the gap of the labyrinth seal 8b is about 15 μm.

The Z linear motors 5a to 5c are disposed outside the guide member 3 equidistantly in the circumferential direction. A movable element 5m of each of the Z linear motors 5a to 5c is a cylindrical frame having a permanent magnet on its inner surface. These frames are fixed to the outer surface of the guide member 3. A stator 5s of each of the Z linear motors 5a to 5c is a coil fixed to a support 1z integrated with the top plate 510. Each stator 5s is connected to a predetermined drive control system via a wire (not shown). Each movable element 5m is driven in the Z direction in accordance with the amount of current supplied from the corresponding drive control system. When the amounts of current supplied to the Z linear motors 5a to 5c are equal, the holding plate 4 can be moved in the Z direction while maintaining its level. The level, i.e., the tilt angle, of the holding plate 4 can be changed by separately changing the amounts of current to be supplied to the Z linear motors 5a to 5c.

Noncontact type displacement sensors 9a to 9c are disposed on the top plate 510 to be adjacent to the linear motors 5a to 5c, respectively. The displacement sensors 9a to 9c have detection ends facing the lower surface of the holding plate 4 to detect a positional change of the holding plate 4 in the Z direction. When outputs from the displacement sensors 9a to 9c are fed back to the drive control systems described above, the holding plate 4 can be positioned in terms of its tilt angle. Namely, the holding plate 4 serves as a Z Tilt stage for the top plate 510.

As shown in FIG. 12, an x linear motor 6x serving as a linear motor for generating a force to move the holding plate 4 in the X direction with respect to the top plate 510 is disposed immediately under substantially the center of the holding plate 4. In addition, two y linear motors 6yl and 6yr for generating a force to move the holding plate 4 in the Y direction with respect to the top plate 510, or to rotate it about the Z axis, are disposed on the left and right sides of the holding plate 4. A movable element 6xm of the x linear motor 6x and movable elements 6ym of the y linear motors 6yl and 6yr are cylindrical frames each having a permanent magnet on its inner surface. These frames are fixed to the outer surface of the guide member 3. A stator 6xs of the x linear motor 6x and stators 6ys of the y linear motors 6yl and 6yr are coils fixed to supports lx and ly integrated with the top plate 510, and are connected to a positioning stage control system 41 identical to that described in the above embodiment via wires (not shown), The movable elements 6x m and 6ym are driven in accordance with the amounts of current supplied from the positioning stage control system 41, so that the driving force for the holding plate 4 acts in the x and Y directions with respect to the top plate 510. More specifically, when a current is supplied to the x linear motor 6x, a translating force acts on the holding plate 4 in the X direction. When currents having the same sign are supplied to the y linear motors 6yl and 6yr, a translating force acts on the holding plate 4 in the Y direction. When currents having different signs are supplied to the y linear motors 6yl and 6yr, a moment for rotating the holding plate 4 about the Z axis acts. How to control the x linear motor 6x and the y linear motors 6yl and 6yr will be described later.

A laser interferometer is used to accurately measure the position of the holding plate 4 in the X and Y directions. An X measurement mirror 10x for measuring fluctuations in the X direction and a Y measurement mirror 10y for measuring fluctuations in the Y direction and in the rotating direction about the Z axis are fixed to the holding plate 4. When an output from the interferometer is fed back to the drive control systems described above, the holding plate 4 can be automatically positioned in the X and Y directions.

When the holding plate 4 moves in the X and Y directions in the stepping manner, first, the X-Y stage 1 moves in the X and Y directions while the laser interferometer measures the position of the holding plate 4 in the X and Y directions. When the top plate 510 is moved by the X-Y stage 1 in the X and Y directions, a force is transmitted to the holding plate 4 through the air film of the radial static pressure bearing 7 provided to the top plate 510, and the holding plate 4 moves to a predetermined position.

The bearing gap of the radial static pressure bearing 7 of this embodiment is designed wide so that the holding plate 4 can be moved in the X and Y directions with respect to the top plate 510. Therefore, if the x linear motor 6x and the y linear motors 6yl and 6yr (to be also referred to as xy linear motors 6 hereinafter) are used as actuators for moving the holding plate 4 with respect to the top plate 510, the holding plate 4 can be fine-adjusted by the xy linear motors 6.

The operation of the positioning apparatus of this embodiment in X- and Y-direction driving will be described in detail with reference to the model diagrams shown in FIG. 15.

Figure 15:
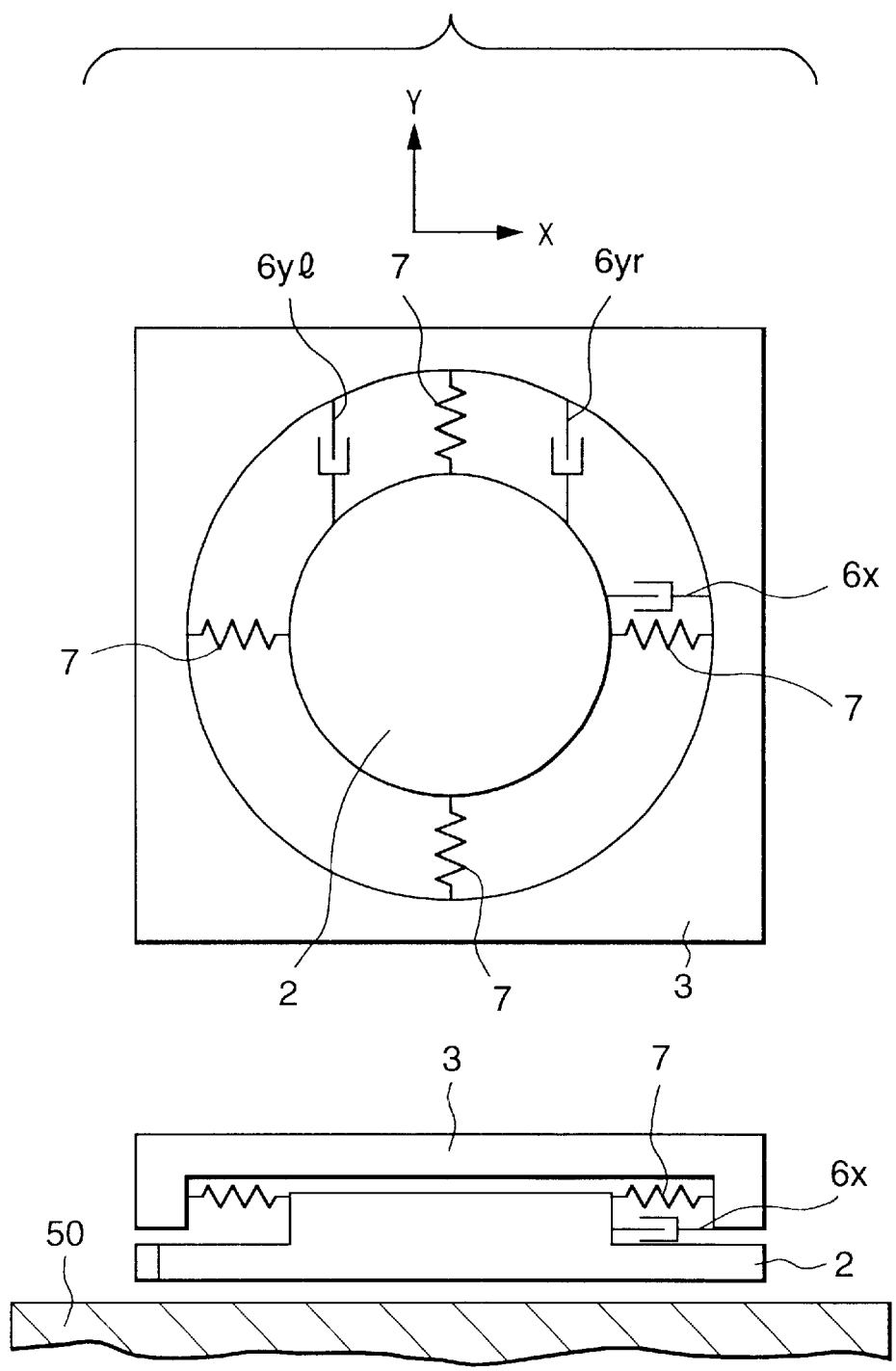
FIG. 15 shows views of a model for the positioning apparatus according to the second embodiment.

The reference numerals of the constituent elements in FIG. 15 correspond to those of the constituent elements of FIGS. 11 to 14. In the above description, the stators of the xy linear motors 6 are fixed to the support integrated with the top plate 510. In FIG. 15, for the sake of descriptive convenience, these stators are provided to the stationary member 2 integrated with the top plate 510. The positions of the xy linear motors 6 in FIG. 15 are different from those in FIG. 12. This is also for the sake of descriptive convenience, and does not alter the function of the xy linear motors 6 of "generating a force in a direction to translate or rotate the holding plate 4 in the XY plane with respect to the top plate 510". The radial static pressure bearings 7 connect the stationary member 2 and guide member 3 to each other in four directions with springs similar to air films. These springs indicate air springs formed by bearings, and are actually noncontact springs. The directions of the air springs are not limited to the four directions, but air springs are present in the entire radial direction. As is obvious from the above arrangement, in the positioning apparatus of this embodiment, the linear motors 6 and the air bearings are arranged in parallel to each other.

Referring to FIG. 15, when the stationary member 2 is moved in the X and Y directions by the X-Y stage (not shown), a force is transmitted to the guide member 3 through the air springs formed by the radial static pressure bearings 7, to move the holding plate (not shown) to a predetermined position.

A case will be described wherein the stage control method of the first embodiment is applied to the second embodiment.

The stationary member 2 corresponding to the accelerating/decelerating stage 32 is accelerated by the X-Y stage 1. Accordingly, the spring element 37 contracts (namely, the gap of the air bearing decreases), the rigidity of the air bearing increases, and the force from the stationary member 2 is transmitted to the guide member 3 through the air bearing. In other words, the force is transmitted from the X-Y stage 1 to the holding plate 4 through the air bearing, to accelerate the holding plate 4. When a large force is transmitted from the X-Y stage 1 (when acceleration is large), the xy linear motors 6, which generate a force in the moving direction between the holding plate 4 and the X-Y stage 1, do not perform a control operation.

When acceleration is almost ended and the force transmitted from the X-Y stage 1 decreases, the positioning stage control system 41 serving as the control system for the xy linear motors 6 starts a control operation to finally position the holding plage 4 for uniform motion. In order to cause the holding plate 4 to travel at a constant speed, when the positioning stage control system 41 controls the xy linear motors 6 to perform positioning, the holding plage 4 should not be substantially, adversely influenced by the spring rigidities of the air films 37 of the radial static pressure bearings 7, and should not receive a disturbance from the X-Y stage 1. For this purpose, the bearing gaps of the radial static pressure bearings 7 are designed to be wide.

Positioning in the uniform motion after acceleration is ended has been described above. Positioning control of the stage apparatus of this embodiment can also be applied when stopping the stage after deceleration. More specifically, the positioning stage control system is turned off when deceleration increases and the driving force transmitted from the X-Y stage 1 through the radial static pressure bearing increases, and is turned on when deceleration decreases. If the motion required for the holding plate is step driving with which the holding plate moves a predetermined distance, the control method of this embodiment may be employed after deceleration.

At the start of a control operation of the positioning stage control system of this embodiment, a deviation correction signal generated by the positioning stage deviation correction signal generator used in the above embodiment may be utilized. In this case as well, at the start of a control operation of the positioning stage control system, with the deviation correction signal, the magnitude and gradient of the correction signal coincide with those of the correction signal obtained when the deviation correction signal is not utilized, and the positioning stage deviation continues smoothly.

Figure 16:
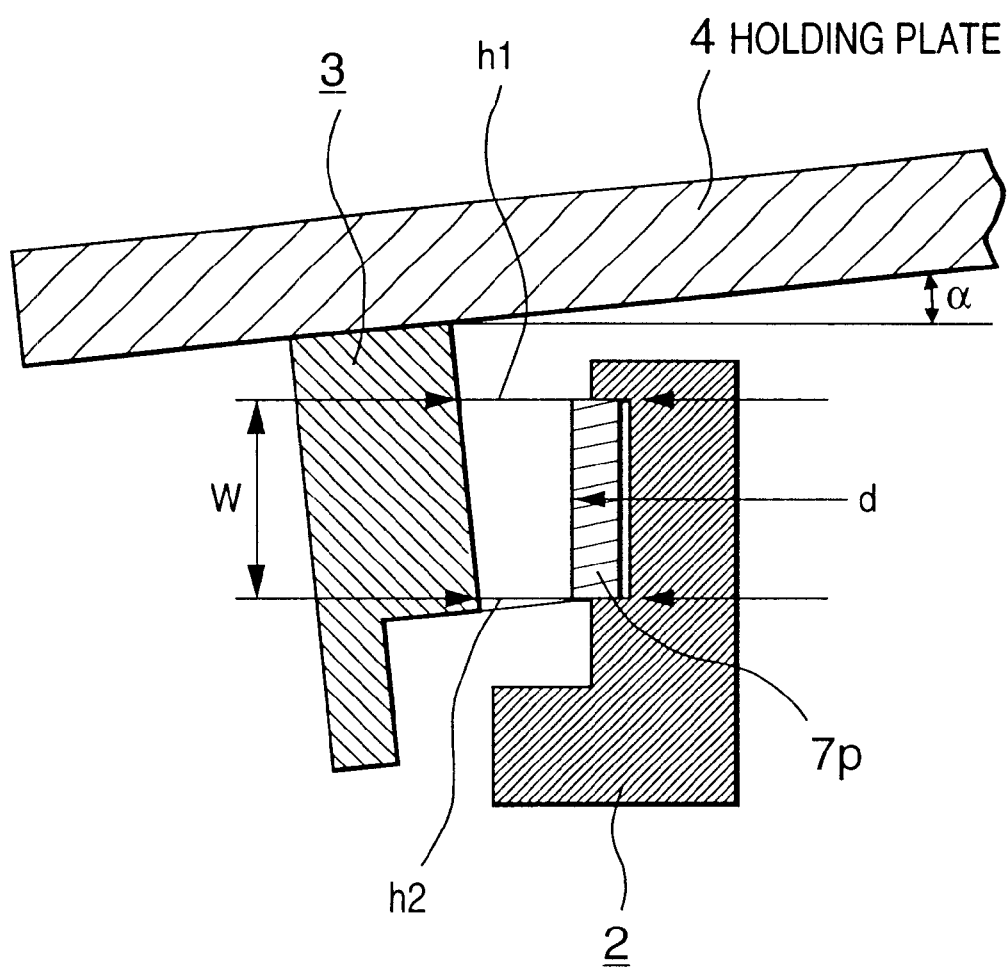
FIG. 16 is a view explaining the bearing gap of a radial static pressure bearing according to the second embodiment.

In this embodiment, the Z linear motors 5a to 5c and xy linear motors 6 are separately supported on the top plate 510, and the holding plate 4 and the top plate 510 are not in contact with each other. Thus, a large vibration will not occur during movement of the holding plate 4. Since most of the weight of the holding plate 4 and the wafer held by it are supported by the pilot-pressure chamber 8, the loads of the linear motors 5a to 5c can be small. When the flat surface of the holding plate 4 is tilted with respect to the XY plane, that is, when the holding plate 4 is tilted with respect to the Z axis, the size of the bearing gap of the porous pad 7p, the gap size of the labyrinth seal 8b, and the gap sizes between the permanent magnets and the coils of the Z linear motors 5a to 5c and xy linear motors 6 change accordingly. These changes are small in the positioning apparatus which aligns the focal point of an exposure apparatus or performs final positioning. Therefore, the porous pad 7p and the guide member 3 will not come into contact with each other, the performance of the labyrinth seal 8b will not degrade greatly, or the driving amounts of the linear motors will not be greatly limited. This is due to the following reason. The minimum gap of each linear motor is about 1 mm to 2 mm. As shown in FIG. 16, letting d be the diameter of the bearing surface of the porous pad 7p, w be the size of the porous pad in the Z direction, and h1 and h2 be the sizes of the two ends of the bearing gap, if d=200 mm, w=20 mm, and a fine-adjustment amount of $\alpha$ for four tilt angles of the holding plate 4 is $3 \times 10^{-4}$ rad, the variation amount (h1–h2)/2 of the size of the bearing gap is about 3 $\mu$m, while the gap size of the porous pad 7p is set to 7 $\mu$m and the gap size of the labyrinth seal 8b is set to 15 $\mu$m.

In this embodiment, in movement of the holding plate (main stage) in the X and Y directions (moving direction), when moving the top plate (substage) in the X and Y directions by the X-Y stag (first actuator), first, the holding plate is accelerated or decelerated by acceleration or deceleration of the X-Y stage. After acceleration or deceleration of the holding plate is ended, a driving operation by the xy linear motors (noncontact actuators) is started, thereby positioning the holding plate. Hence, the holding plate can be positioned in the X and Y directions at a high speed and high precision without high-heat generation.

In this embodiment, an X-Y stage utilizing linear motors is used as a first actuator for driving the top plate in the X and Y directions. The first actuator is not limited to this, but can be of any type so far as it can drive the top plate in the X and Y directions at a predetermined precision. For example, an X-Y stage which drives the top plate with a ball screw or cylinder can be used.

In this embodiment, a cylindrical radial static pressure bearing is used as a static pressure bearing for supporting the holding plate from the top plate in the X and Y directions. The present invention is not limited to this, and separate static pressure bearings may be provided in the X and Y directions to support the holding plate. The bearing used in the present invention is not limited to a static pressure bearing, but can be of any type as far as it is a noncontact bearing, and can be, for example, a noncontact bearing utilizing the repulsive force of a magnet or the like. The holding plate is desirably supported by the top plate such that it can move with respect to the top plate in the Z direction, the rotating direction about the Z axis, and the tilt direction (tilt direction with respect to the Z axis).

In this embodiment, the support force of the bearing and the driving force of the xy linear motors act between the top plate and the holding plate to maintain those plates to be parallel to each other in the X and Y directions. The term "parallel" means that not only are the bearing and the xy linear motors disposed parallel to each other, but also the bearing and each xy linear motor can transmit a force between the top plate and the holding plate, as shown in the embodiment.

In this embodiment, the support force in the Z direction for the holding plate is generated by the pilot-pressure chamber having a labyrinth seal. However, the present invention is not limited to this, and a support al force in the Z direction may be generated by tightly closing the pilot-pressure chamber with a rubber member or the like. The support force in the Z direction for the holding plate is not limited to one generated by air, but a repulsive force of a magnet or the like can be used.

In this embodiment, a positional change in tilt angle of the holding plate is detected by the displacement sensors disposed on the top plate. However, the present invention is not limited to this, but position information on the holding plate in the Z direction may be measured from a reference member outside the positioning apparatus by means of an interferometer or the like.

Third Embodiment

Figure 17:
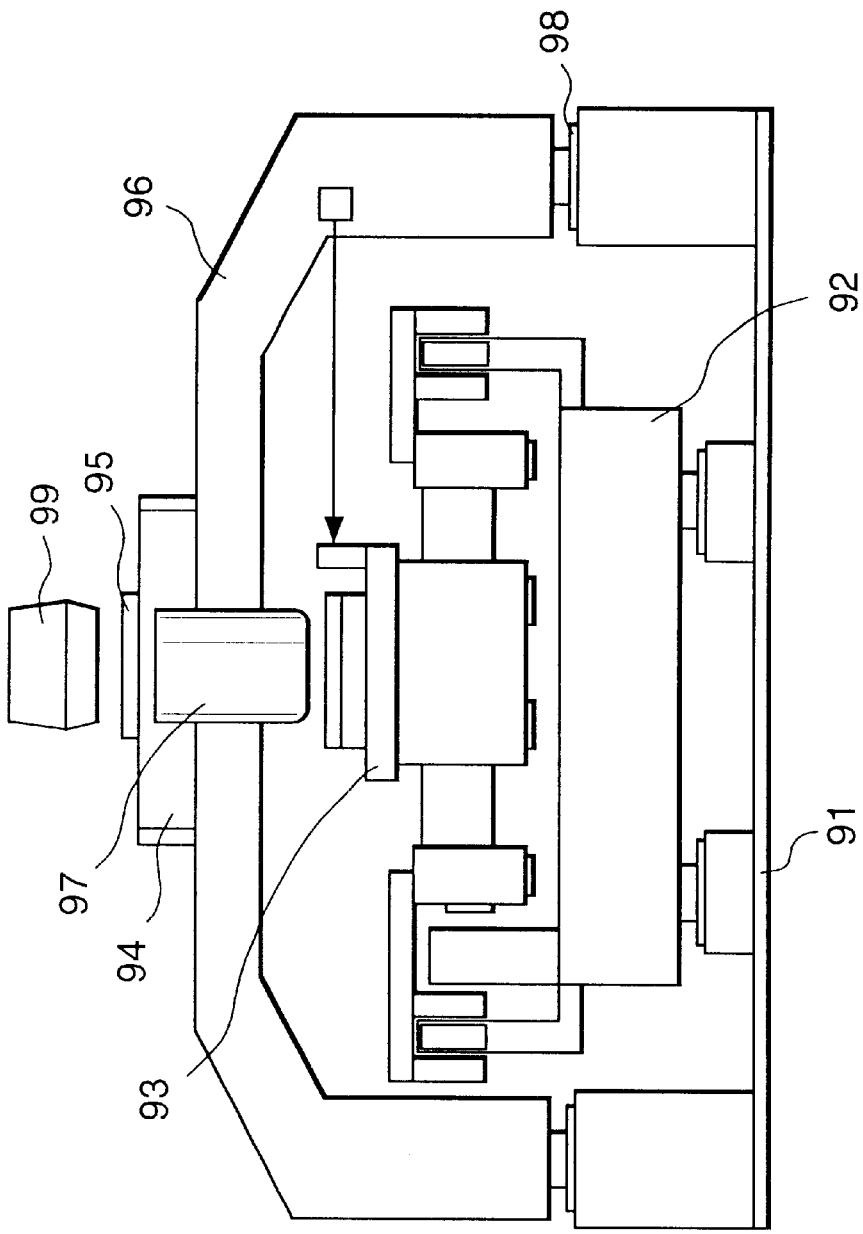
FIG. 17 is a schematic view of a scanning exposure apparatus according to the third embodiment.

An embodiment of a scanning type exposure apparatus, on which the positioning apparatus according to the above embodiment is mounted as a wafer stage, will be described with reference to FIG. 17.

A lens barrel supporting member plate 96 is supported on a floor or base plate 91 through dampers 98. The lens barrel supporting member 96 supports a reticle surface plate 94, and a projection optical system 97 located between a reticle stage 95 and a wafer stage 93.

The wafer stage 93 is supported on a stage base surface plate 92 supported on the floor or base plate 91, and mounts a wafer on it to position the wafer. The reticle stage 95 is supported on the reticle surface plate 94 supported by the lens barrel supporting member 96, and can move while supporting a reticle having a circuit pattern. Exposure light for exposing the reticle mounted on the reticle stage 95 onto the wafer on the wafer stage 93 is generated by an illumination optical system 99.

The wafer stage 93 is scanned in synchronism with the reticle stage 95. While the reticle stage 95 and wafer stage 93 are scanned, their positions are continuously detected by the interferometer and are fed back to the driving units of the reticle stage 95 and wafer stage 93, respectively. Thus, the positions where the reticle stage 95 and wafer stage 93 start scanning can be synchronized accurately, and the scanning speed in the constant-speed scanning region can be controlled at high precision. While the reticle stage 95 and wafer stage 93 are being scanned with respect to the projection optical system 97, a reticle pattern is exposed onto the wafer to transfer a circuit pattern.

In this embodiment, the positioning apparatus of the above embodiment is used as the wafer stage. In step motion during which the stage is accelerated or decelerated, the holding plate is accelerated by accelerating the X-Y stage described above. In scanning exposure during which the stage moves at a constant speed, the holding plate is positioned by the xy linear motors described above. As a result, high-speed, high-precision exposure is enabled.

Alternatively, a positioning apparatus in which a static pressure bearing and linear motors as those described in the above embodiment are arranged in parallel to each other may be used for the reticle stage.

Fourth Embodiment

Figure 18:
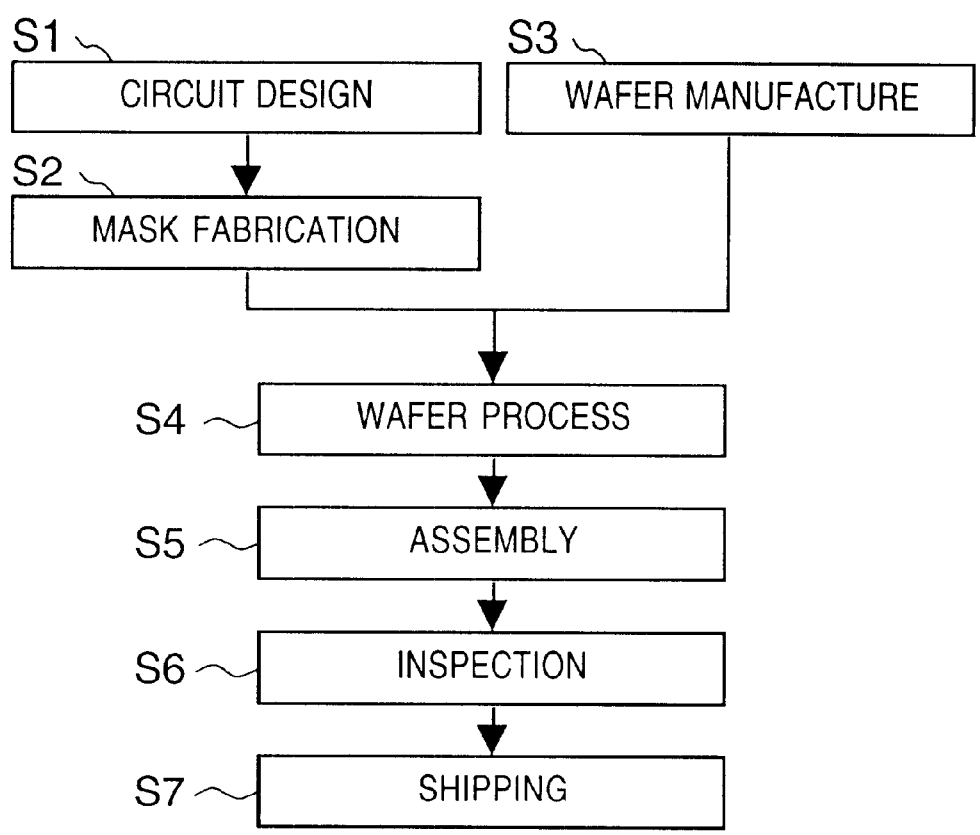
FIG. 18 is a flow chart showing the flow of the manufacture of a semiconductor device.

An embodiment of a semiconductor device manufacturing method utilizing the exposure apparatus described above will be described. FIG. 18 shows the flow of the manufacture of a semiconductor device (a semiconductor chip such as an IC or LSI, a liquid crystal panel, a CCD, or the like). In step 1 (circuit design), pattern design of the semiconductor device is performed. In step 2 (mask fabrication), a mask formed with the designed circuit pattern is fabricated. In step 3 (wafer manufacture), a wafer is manufactured by using a material such as silicon. Step 4 (wafer process) is called a pre-process where the mask and wafer prepared above are used to form an actual circuit on the wafer in accordance with lithography. Step 5 (assembly) is called a post-process where the wafer fabricated in step 4 is formed into semiconductor chips. Step 5 includes an assembly step (dicing, bonding), a packaging step (chip encapsulation), and the like. In step 6 (inspection), inspection such as an operation confirmation test, a durability test, and the like of the semiconductor device manufactured in step 5 is performed. The semiconductor device is completed through these steps, and is shipped (step 7).

Figure 19:
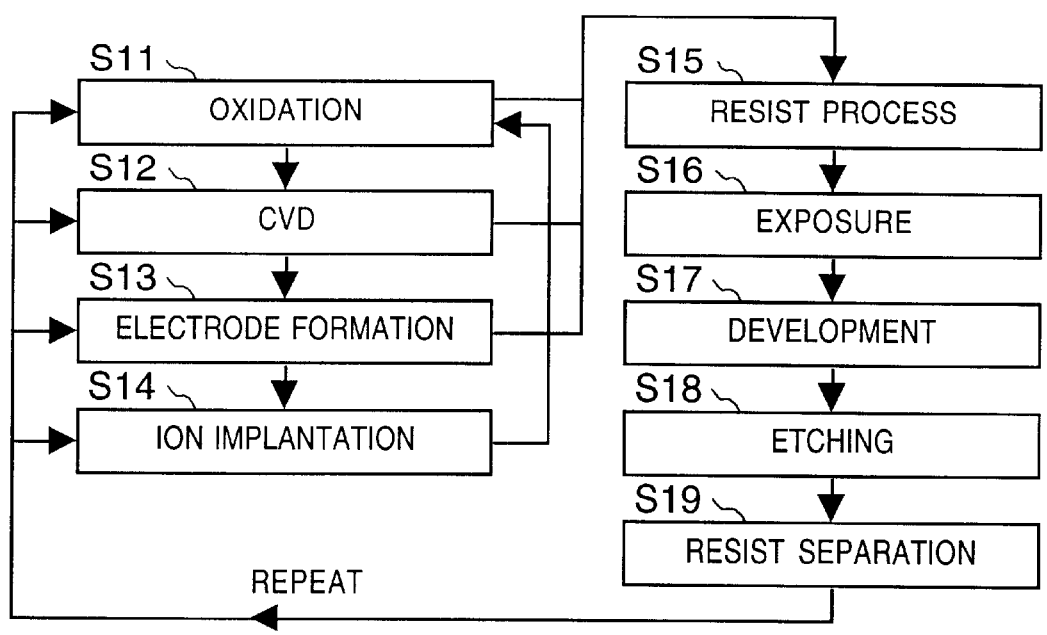
FIG. 19 is a flow chart showing the wafer process.
Figure 20:
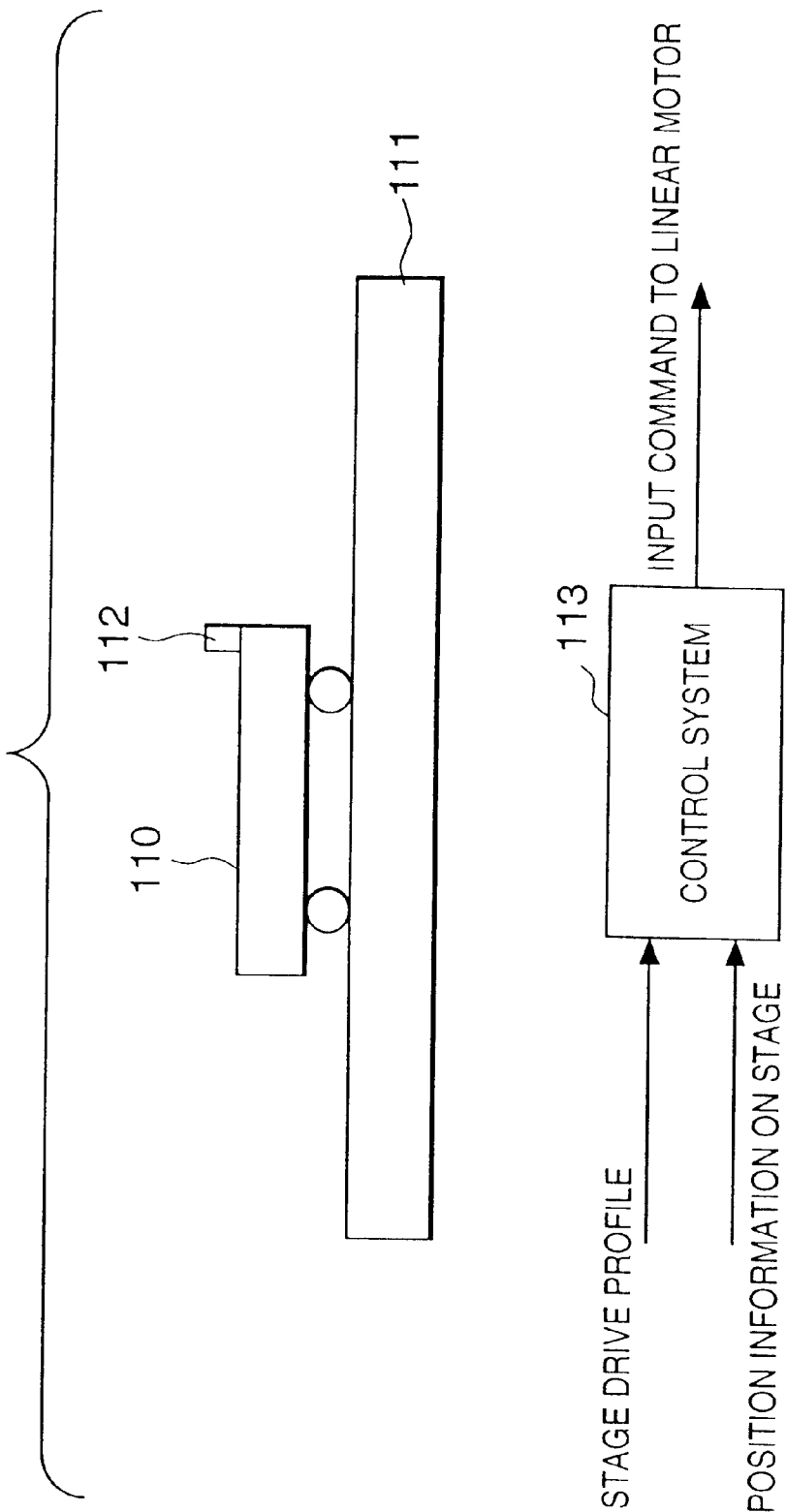
FIG. 20 is a diagram showing a model for aconventional positioning apparatus.

FIG. 19 shows a detailed flow of the above wafer process. In step 11 (oxidation), the surface of the wafer is oxidized. In step 12 (CVD), an insulating film is formed on the wafer surface. In step 13 (electrode formation), electrodes are formed on the wafer by vapor deposition. In step 14 (ion implantation), ions are implanted in the wafer. In step 15 (resist process), a photosensitive agent is applied to the wafer. In step 16 (exposure), the circuit pattern of the mask is printed onto the wafer and exposed by the exposure apparatus described above. In step 17 (development), the exposed wafer is developed. In step 18 (etching), a portion other than the developed resist image is removed. In step 19 (resist separation), the resist which has become unnecessary after etching is removed. These steps are repeatedly performed to form circuit patterns on the wafer in a multiple manner. When the manufacturing method of this embodiment is used, a high-integration semiconductor device which is conventionally difficult to manufacture can be manufactured.

According to the present invention, the main stage can be positioned while suppressing heat generation of the actuator.

When the control operation of the actuator is started, a quick deviation correction control operation can be suppressed.

The position deviation signal can be smoothly, continuously converged.

The main stage can be positioned in the two-dimensional directions at high speed and high precision.

The main stage can be positioned in the six axial directions at high speed and high precision.

The positional deviation of the main stage can be converted to a target position smoothly and continuously.

As many apparently widely different embodiments of the present invention can be made without departing from the spirit and scope thereof, it is to be understood that the invention is not limited to the specific embodiments thereof except as defined in the appended claims.

What is claimed is:

1. A positioning apparatus comprising:
    a base having a reference surface;
    a substage movable with respect to said base;
    a first actuator for moving said substage with respect to said base;
    a main stage movable together with said substage with respect to said base;
    a member for transmitting a force between said main stage and said substage; and
    a second actuator for positioning said main stage, wherein
        when accelerating/decelerating said main stage, said substage is driven by using said first actuator to transmit a force from said substage to said main stage through said transmission member, and
        when causing said main stage to move at a constant speed or to stop, said main stage is positioned by using said second actuator.

2. The apparatus according to claim 1, wherein said second actuator is controlled in accordance with a time that elapses from a start time of acceleration/deceleration.

3. The apparatus according to claim 1, wherein said second actuator is controlled in accordance with a magnitude of acceleration/deceleration of said substage.

4. The apparatus according to claim 1, wherein said second actuator is controlled in accordance with a speed of said main stage.

5. The apparatus according to claim 1, wherein said second actuator is controlled in accordance with a magnitude of a positional deviation of said main stage.

6. The apparatus according to claim 1, further comprising a control system for controlling said second actuator, which corrects a positional deviation signal of said main stage with respect to a target position by using a deviation correction signal, and controls said second actuator on the basis of the corrected position deviation signal.

7. The apparatus according to claim 6, further comprising a deviation correction signal generator for generating the deviation correction signal.

8. The apparatus according to claim 6, wherein the deviation correction signal has a magnitude which is, upon a start of controlling said second actuator, substantially equal to that of the positional deviation correction signal obtained when said control system for controlling said second actuator starts a control operation.

9. The apparatus according to claim 8, wherein the deviation correction signal has a gradient which is, upon a start of controlling said second actuator, substantially equal to that of the positional deviation signal obtained when said control system for controlling said second actuator starts the control operation.

10. The apparatus according to claim 1, wherein said second actuator is a noncontact actuator which generates a driving force in a noncontact manner.

11. The apparatus according to claim 10, wherein said second actuator is a linear motor.

12. The apparatus according to claim 11, wherein said linear motor has a movable element provided to said main stage, and a stator provided to said base.

13. The apparatus according to claim 11, wherein said linear motor has a movable element provided to said main stage, and a stator provided to said substage.

14. The apparatus according to claim 1, wherein said transmission member transmits a force between said main stage and said substage in a direction along which said substage moves.

15. The apparatus according to claim 14, wherein said transmission member is a spring element.

16. The apparatus according to claim 1, wherein said transmission member is a noncontact bearing which keeps said main stage and said substage apart from with each other.

17. The apparatus according to claim 16, wherein said noncontact bearing has a static pressure bearing or a bearing utilizing magnetism.

18. The apparatus according to claim 1, wherein said main stage is supported on said reference surface.

19. The apparatus according to claim 1, wherein said main stage is placed on said substage.

20. The apparatus according to claim 19, wherein said substage is a two-dimensional stage movable in two-dimensional directions on said reference surface.

21. The apparatus according to claim 20, wherein said transmission member has a radial bearing.

22. The apparatus according to claim 20, wherein said main stage is movable with respect to said substage in a direction parallel to said reference surface.

23. The apparatus according to claim 19, further comprising a driving mechanism for driving said main stage with respect to said substage in a direction perpendicular to said reference surface.

24. The apparatus according to claim 23, wherein said main stage is movable with respect to said substage in six axial directions.

25. The apparatus according to claim 19, further comprising a support mechanism for supporting said main stage with respect to said substage in a vertical direction, said support mechanism utilizing a reaction force of a pilot-pressure chamber or a repulsive force of a magnet.

26. An exposure apparatus having said positioning apparatus according to claim 1.

27. The apparatus according to claim 26, further comprising using the positioning apparatus as a wafer stage.

28. A device manufacturing method comprising the steps of:
    providing said exposure apparatus according to claim 26; and
    transferring a pattern formed on a reticle onto a wafer with said exposure apparatus.

29. The method according to claim 28, further comprising the steps of:
    applying a photosensitive agent on the wafer; and
    developing the photosensitized wafer.

30. A positioning method comprising:
    the first acceleration step of accelerating a substage;
    the second acceleration step of transmitting a driving force from said substage to a main stage through a noncontact bearing provided between said substage and said main stage, thereby accelerating said main stage; and the positioning step of positioning said main stage with an actuator provided between said substage and said main stage, the positioning step further having the correction step of correcting a position deviation signal with respect to a target position, and the control step of controlling said actuator on the basis of the corrected position deviation signal.

31. The method according to claim 30, wherein the correction step comprises generating a deviation correction signal having the same magnitude as that of the position deviation signal, and controlling said actuator on the basis of a difference in magnitude between the position deviation signal and the deviation correction signal.

32. The method according to claim 31, wherein the correction step comprises generating a deviation correction signal having the same gradient as that of the position deviation signal, and controlling said actuator on the basis of a difference in gradient between the position deviation signal and the deviation correction signal.

* * * * *

UNITED STATES PATENT AND TRADEMARK OFFICE
CERTIFICATE OF CORRECTION

PATENT NO. : 6,442,858 B1
DATED : September 3, 2002
INVENTOR(S) : Tosiya Asano

It is certified that error appears in the above-identified patent and that said Letters Patent is hereby corrected as shown below:

Column 2,
Line 6, "disorders" should read -- disturbs --.

Column 4,
Line 7, "system." should read -- system; --.
Line 29, "aconventional" should read -- a conventional --.
Line 45, "Tee" should read -- The --.
Line 59, "in" should be deleted.

Column 5,
Line 14, "stage" should read -- stage 32 to --.

Column 6,
Line 18, "10" should read -- 1) --.
Lines 26-31, should be deleted.
Line 34, "position" should read -- positioning -- and "stage" should read -- stage 33 --.

Column 8,
Line 60, "x direction" should read -- X direction --.

Column 10,
Line 34, "6$x$ m" should read -- 6$xm$ --.
Line 37, "x and" should read -- X and --.

Column 11,
Line 62, "plage" should read -- plate --.

Column 13,
Line 31, "a1" should be deleted.

UNITED STATES PATENT AND TRADEMARK OFFICE
CERTIFICATE OF CORRECTION

PATENT NO.   : 6,442,858 B1
DATED        : September 3, 2002
INVENTOR(S)  : Tosiya Asano It is certified that error appears in the above-identified patent and that said Letters Patent is hereby corrected as shown below:

Column 16,
Line 17, "with" should be deleted.

Signed and Sealed this

Eighteenth Day of February, 2003

JAMES E. ROGAN
*Director of the United States Patent and Trademark Office*